(12) United States Patent
Yamauchi et al.

(10) Patent No.: US 11,942,438 B2
(45) Date of Patent: Mar. 26, 2024

(54) ELECTRONIC COMPONENT, MULTIPLEXER, AND MODULE

(71) Applicant: TAIYO YUDEN CO., LTD., Tokyo (JP)

(72) Inventors: Motoi Yamauchi, Tokyo (JP); Masato Ito, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 581 days.

(21) Appl. No.: 17/176,804

(22) Filed: Feb. 16, 2021

(65) Prior Publication Data
US 2021/0288001 A1 Sep. 16, 2021

(30) Foreign Application Priority Data
Mar. 16, 2020 (JP) .................................. 2020-045802

(51) Int. Cl.
*H01L 23/00* (2006.01)
*H01L 23/02* (2006.01)
(Continued)

(52) U.S. Cl.
CPC ............ *H01L 23/562* (2013.01); *H01L 23/02* (2013.01); *H01L 23/31* (2013.01); *H03H 9/0571* (2013.01); *H03H 9/0576* (2013.01); *H10N 30/88* (2023.02); *H01L 23/498* (2013.01); *H01L 23/49805* (2013.01); *H01L 23/49838* (2013.01)

(58) Field of Classification Search
CPC ............ H01L 23/498; H01L 23/49805; H01L 23/49838; H01L 23/562; H01L 24/06; H01L 2224/0401; H01L 2224/03132; H01L 2224/03134; H01L 2224/03135; H01L 2224/03179; H01L 2224/03157
See application file for complete search history.

(56) References Cited

U.S. PATENT DOCUMENTS

| 2012/0112854 A1 | 5/2012 | Iwaki et al. ................... 333/133 |
| 2018/0108965 A1 | 4/2018 | Huang et al. |
| 2021/0240049 A1 | 8/2021 | Abe et al. |

FOREIGN PATENT DOCUMENTS

| JP | H 10-224175 A | 8/1998 |
| JP | 2000-261216 A | 9/2000 |

(Continued)

OTHER PUBLICATIONS

Notification of Reasons for Refusal dated Nov. 21, 2023 in a counterpart Japanese Patent Application No. 2020-045802.

*Primary Examiner* — David A Zarneke
(74) *Attorney, Agent, or Firm* — Stein IP, LLC

(57) ABSTRACT

An electronic component includes a first substrate having a substantially quadrangular planar shape and having a first surface and a second surface, the first surface and the second surface being opposite to each other, an element disposed on the first surface, four first terminals located adjacent to four corners on the second surface, respectively, and a second terminal located between the first terminals at respective ends of each of two sides opposite to each other of the second surface, an area of the second terminal being smaller than an area of each of the first terminals at the respective ends of each of the two sides, a width of the second terminal in an extension direction of each of the two sides being equal to or less than a width of each of the first terminals at the respective ends of each of the two sides in the extension direction.

15 Claims, 13 Drawing Sheets

(51) Int. Cl.
*H01L 23/31* (2006.01)
*H01L 23/498* (2006.01)
*H03H 9/05* (2006.01)
*H10N 30/88* (2023.01)

(56) References Cited

FOREIGN PATENT DOCUMENTS

| | | |
|---|---|---|
| JP | 2004-063852 A | 2/2004 |
| JP | 2005-072091 A | 3/2005 |
| JP | 2005-116622 A | 4/2005 |
| JP | 2006-210994 A | 8/2006 |
| JP | 2010-192974 A | 9/2010 |
| JP | 2012-105097 A | 5/2012 |
| WO | WO 2019/239683 A1 | 12/2019 |

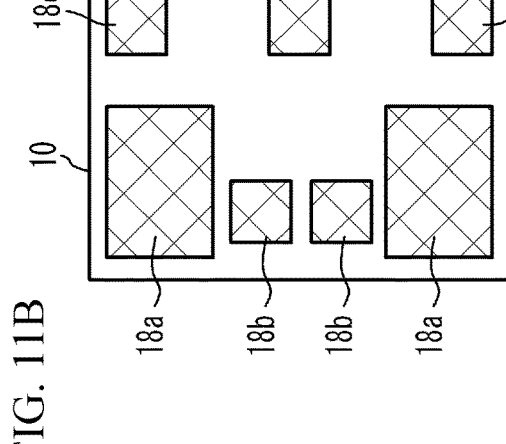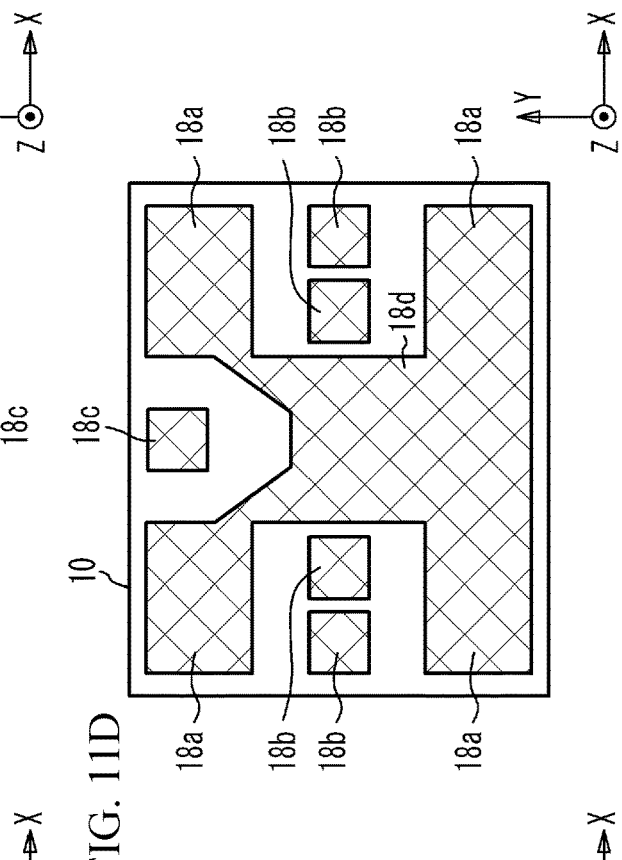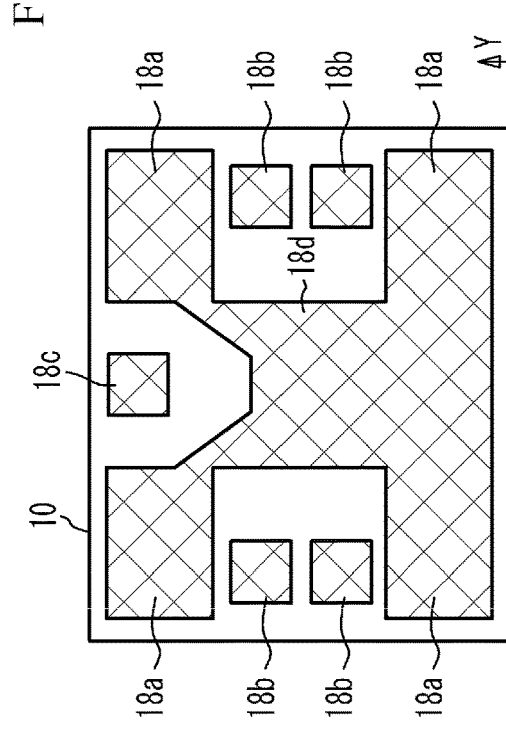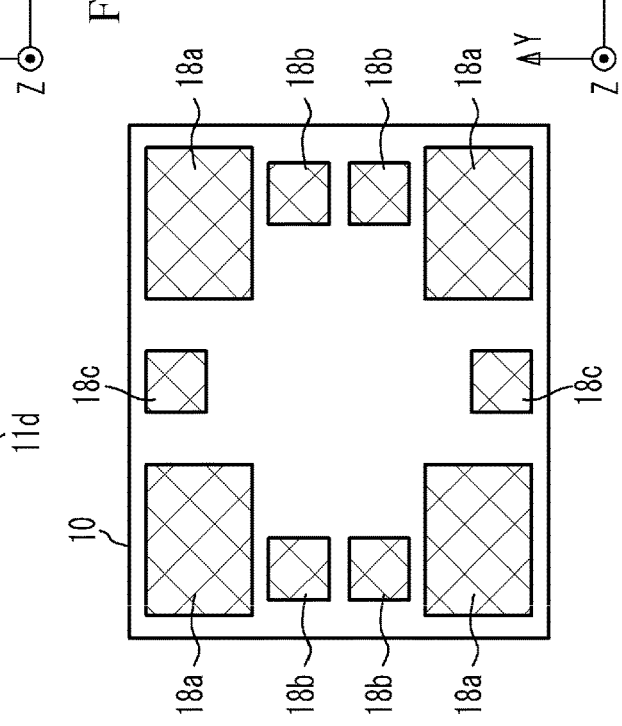

ELECTRONIC COMPONENT, MULTIPLEXER, AND MODULE

CROSS-REFERENCE TO RELATED APPLICATION

This application is based upon and claims the benefit of priority of the prior Japanese Patent Application No. 2020-045802, filed on Mar. 16, 2020, the entire contents of which are incorporated herein by reference.

FIELD

A certain aspect of the present embodiments relates to an electronic component, a multiplexer, and a module.

BACKGROUND

There has been known an electronic component in which an element such as an acoustic wave element is mounted on the upper surface of the substrate, and terminals electrically connected to the element are disposed on the lower surface of the substrate as disclosed in Japanese Patent Application Publication No. 2012-105097. The element is, for example, a multiplexer including a plurality of filters.

SUMMARY

The electronic component is mounted on a mounting board by bonding the terminals onto the mounting board using a bonding layer made of solder or the like. However, when a shock is applied to the mounting board, the electronic component is damaged.

The objective of the present disclosure is to provide an electronic component and a multiplexer having high reliability.

According to a first aspect of the present disclosure, there is provided an electronic component including a first substrate having a substantially quadrangular planar shape and having a first surface and a second surface, the first surface and the second surface being opposite to each other, an element disposed on the first surface, four first terminals located adjacent to four corners on the second surface, respectively, and a second terminal located between the first terminals at respective ends of each of two sides opposite to each other of the second surface, an area of the second terminal being smaller than an area of each of the first terminals at the respective ends of each of the two sides, a width of the second terminal in an extension direction of each of the two sides being equal to or less than a width of each of the first terminals at the respective ends of each of the two sides in the extension direction.

According to a second aspect of the present disclosure, there is provided a multiplexer including the above electronic component.

According to a third aspect of the present disclosure, there is provided a module including the above multiplexer.

BRIEF DESCRIPTION OF THE DRAWINGS

FIG. 11A to FIG. 11D are plan views illustrating the lower surface of the substrate in the first embodiment;

DETAILED DESCRIPTION

Hereinafter, a description will be given of embodiments of the present disclosure with reference to the accompanying drawings.

First Embodiment

Figure 1A:
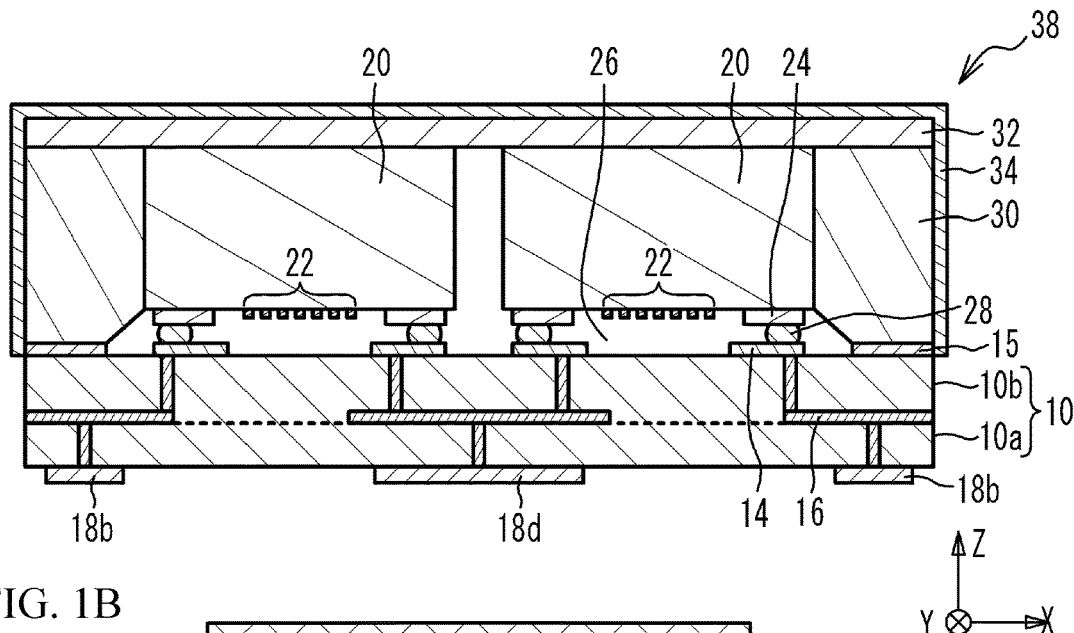
FIG. 1A is a cross-sectional view of an acoustic wave device in accordance with a first embodiment.
Figure 1B:
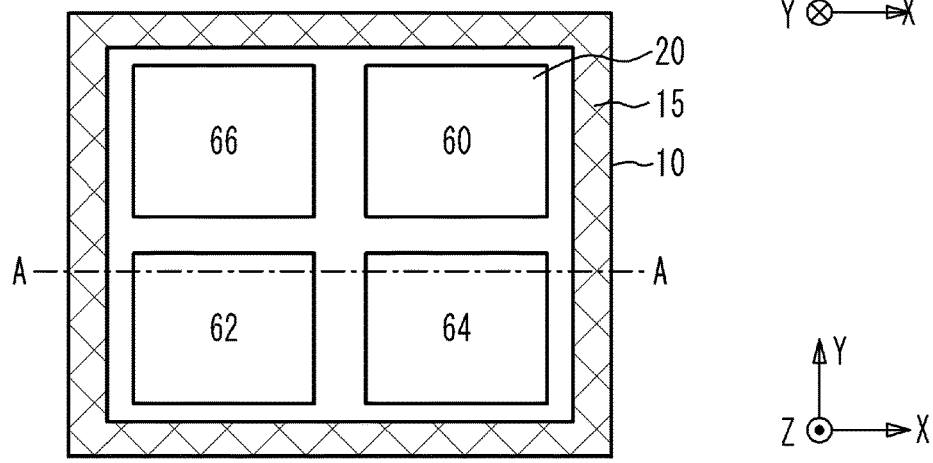
FIG. 1B and FIG. 1C are plan views of the acoustic wave device in accordance with the first embodiment.
Figure 1C:
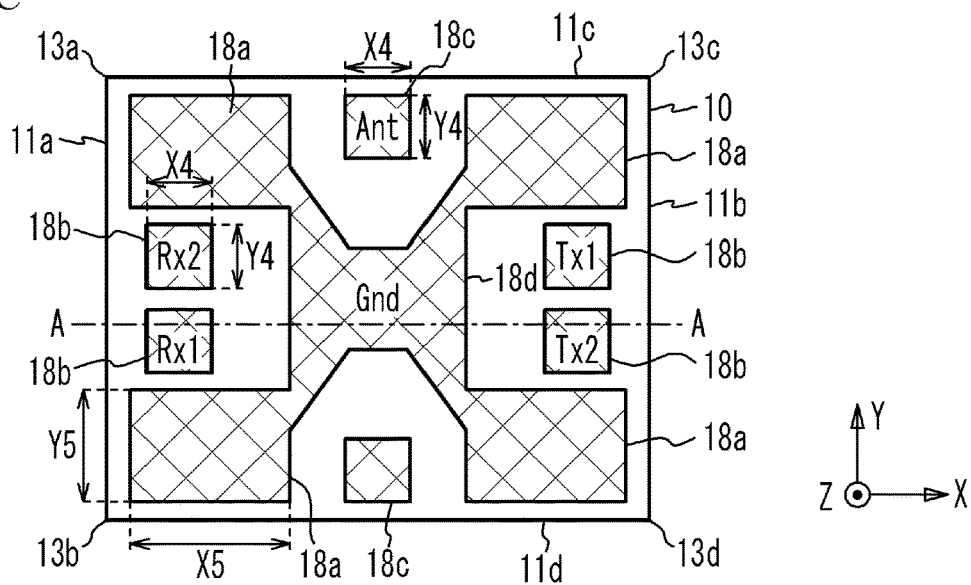

A first embodiment is an exemplary quadplexer as an example of the multiplexer. FIG. 1A is a cross-sectional view of an acoustic wave device in accordance with a first embodiment, and FIG. 1B and FIG. 1C are plan views of the acoustic wave device in accordance with the first embodiment. FIG. 1B illustrates a metal layer 15, which is on the upper surface of a substrate 10, and a substrate 20. FIG. 1C is a plan view obtained by transparently viewing terminals 18a to 18d on the lower surface of the substrate 10 from above the substrate 10. FIG. 1A is a cross-sectional view taken along line A-A in FIG. 1B and FIG. 1C. The direction in which the substrates 10 and 20 are stacked (the stack direction of the substrates 10 and 20) is defined as a Z direction, the directions in which the sides of the substrate 10 extend (the extension directions of the sides of the substrate 10) are defined as an X direction and a Y direction.

As illustrated in FIG. 1A to FIG. 1C, in an electronic component 38, a planar shape of the substrate 10 is a substantially quadrangular shape. The substantially quadrangular shape includes the substrate 10 of which at least a part of the outer periphery is curved to the extent of the manufacturing error. The substrate 10 includes insulating layers 10a and 10b that are stacked. The insulating layers 10a and 10b are made of, for example, low temperature co-fired ceramics (LTCC). Metal layers 14 and 15 are located on the upper surface of the substrate 10. The metal layer 15 is located in a ring shape in the periphery of the substrate 10 so as to surround the substrates 20. The terminals 18a to 18d are disposed on the lower surface of the substrate 10. Internal wiring lines 16 connecting the metal layers 14 to the terminals 18a to 18d are provided in the substrate 10. The metal layers 14 and 15, the internal wiring lines 16, and the terminals 18a to 18d are, for example, metal layers such as, but not limited to, copper layers, silver layers, gold layers, aluminum layers or nickel layers.

Four substrates 20 are flip-chip mounted on the substrate 10. An acoustic wave element 22 and metal layers 24 are disposed on the lower surface of the substrate 20. The metal layer 24 is, for example, a copper layer, a gold layer, or an aluminum layer, and is electrically connected to the acoustic wave element 22. The metal layers 14 and 24 are bonded by bumps 28. The bump 28 is, for example, a metal bump such as a gold bump, a copper bump, or a solder bump. The terminals 18a to 18d are electrically connected to the acoustic wave elements 22 through the internal wiring lines 16, the metal layers 14, the bumps 28, and the metal layers 24.

A sealing portion 30 is located on the substrate 10 so as to surround the substrates 20. The sealing portion 30 is made of a metal such as solder or an insulating material such as resin. The sealing portion 30 is bonded on the upper surface of the metal layer 15. A plate-like lid 32 is disposed on the upper surfaces of the substrates 20 and the upper surface of the sealing portion 30. The lid 32 is a metal plate such as a kovar plate or an insulating plate. A protective film 34 is formed so as to cover the lid 32 and the sealing portion 30. The protective film 34 is a metal film such as a nickel film or an insulating film. At least one of the metal layer 15, the lid 32, or the protective film 34 may be omitted. The sealing portion 30 seals the acoustic wave elements 22 within an air gap 26.

As illustrated in FIG. 1C, the lower surface of the substrate 10 has a substantially quadrangular shape, and four terminals 18a are located adjacent to four corners 13a to 13d of the quadrangle, respectively. The terminals 18b are located between the terminals 18a at respective ends of a side 11a extending in the Y direction, and the terminals 18b are also located between the terminals 18a at respective ends of a side 11b extending in the Y direction. Two terminals 18b are located between the terminals 18a at respective ends of each of the sides 11a and 11b. A first side, which is closer to the side (11a or 11b), of the terminal 18b between the terminals 18a at respective ends of the side (11a or 11b) may be arranged closer to the center of the lower surface of the substrate 10 than first sides, which are closer to the side (11a or 11b), of the terminals 18a at respective ends of the side (11a or 11b). That is, the first side, which is closer to the side (11a or 11b), of the terminal 18b is farther from the side (11a or 11b) than the first side, which is closer to the side (11a or 11b), of the terminal 18a. The terminal 18c is located between the terminals 18a at respective ends of a side 11c extending in the X direction, and the terminal 18c is also located between the terminals 18a at respective ends of a side 11d extending in the X direction. One terminal 18c is located between the terminals 18a at respective ends of the side 11c, and one terminal 18c is located between the terminals 18a at respective ends of the side 11d. The four terminals 18a are electrically interconnected through the terminal 18d on the lower surface of the substrate 10. The width of the terminal 18a in the X direction is represented by X5, and the width of the terminal 18a in the Y direction is represented by Y5. The width of each of the terminals 18b and 18c in the X direction is represented by X4, and the width of each of the terminals 18b and 18c in the Y direction is represented by Y4. The width X5 is greater than the width X4, and the width Y5 is greater than the width Y4.

Figure 2A:
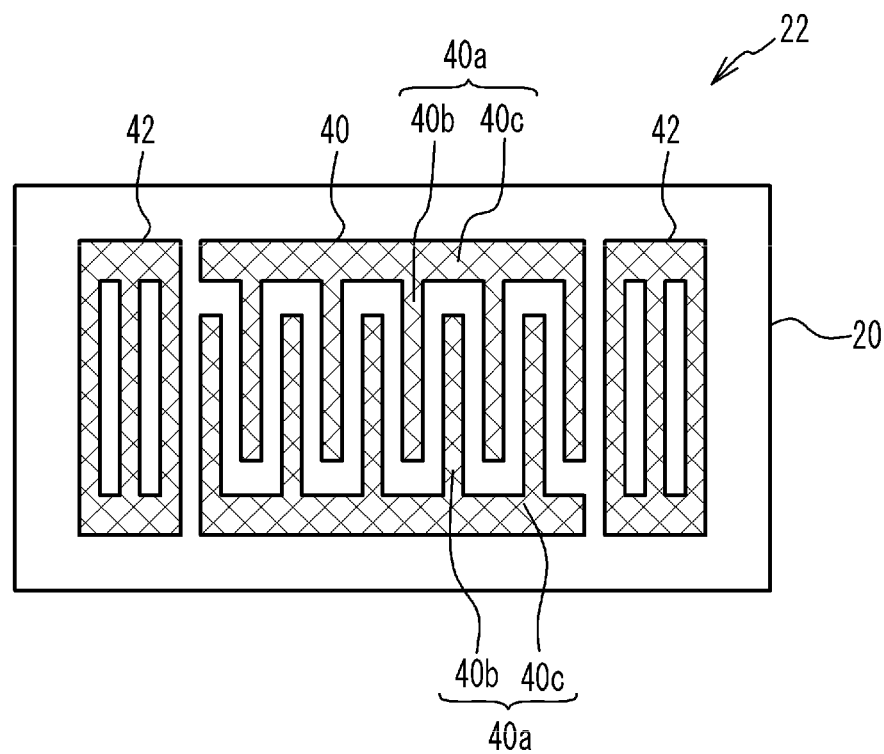
FIG. 2A is a plan view illustrating an example of an acoustic wave element in the first embodiment.
Figure 2B:
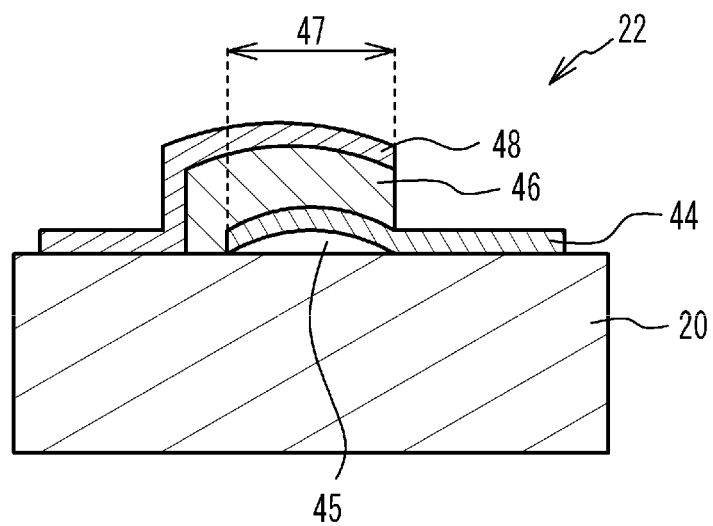
FIG. 2B is a cross-sectional view illustrating another example of the acoustic wave element in the first embodiment.

FIG. 2A is a plan view of an exemplary acoustic wave element in the first embodiment, and FIG. 2B is a cross-sectional view of another exemplary acoustic wave element in the first embodiment. In FIG. 2A, the acoustic wave element 22 is a surface acoustic wave resonator, and in FIG. 2B, the acoustic wave element 22 is a piezoelectric thin film resonator.

As illustrated in FIG. 2A, an interdigital transducer (IDT) 40 and reflectors 42 are formed on the substrate 20. The IDT 40 includes a pair of comb-shaped electrodes 40a opposite to each other. The comb-shaped electrode 40a includes a plurality of electrode fingers 40b and a bus bar 40c connecting the electrode fingers 40b. The reflectors 42 are located at both sides of the IDT 40. The IDT 40 excites the surface acoustic wave in the substrate 20. The wavelength of the acoustic wave is approximately equal to the pitch of the electrode fingers 40b of one of the pair of the comb-shaped electrodes 40a. That is, the wavelength of the acoustic wave is approximately equal to two times the pitch of the electrode fingers 40b of the pair of the comb-shaped electrodes 40a. The IDT 40 and the reflectors 42 are formed of, for example, an aluminum film, a copper film, or a molybdenum film. A protective film or a temperature compensation film may be formed on the substrate 20 so as to cover the IDT 40 and the reflectors 42. The substrate 20 is, for example, a piezoelectric substrate such as a lithium tantalate substrate or a lithium niobate substrate. The substrate 20 may include a piezoelectric substrate and a support substrate bonded on the upper surface of the piezoelectric substrate.

As illustrated in FIG. 2B, a piezoelectric film 46 is located on the substrate 20. A lower electrode 44 and an upper electrode 48 are located so as to sandwich the piezoelectric film 46 therebetween. An air gap 45 is formed between the lower electrode 44 and the substrate 20. The region where the lower electrode 44 and the upper electrode 48 are opposite to each other across the piezoelectric film 46 is a resonance region 47. In the resonance region 47, the lower electrode 44 and the upper electrode 48 excite the acoustic wave in the thickness extension mode within the piezoelectric film 46. The substrate 20 is, for example, a sapphire substrate, a spinel substrate, an alumina substrate, a glass substrate, a crystalline quartz substrate, or a silicon substrate. The lower electrode 44 and the upper electrode 48 are formed of a metal film such as, but not limited to, a ruthenium film. The piezoelectric film 46 is, for example, an aluminum nitride film. An acoustic mirror reflecting the acoustic wave may be provided instead of the air gap 45.

The acoustic wave element 22 includes the electrodes exciting the acoustic wave. Thus, not to restrict the acoustic wave, the acoustic wave element 22 is covered with the air gap 26.

Figure 3A:
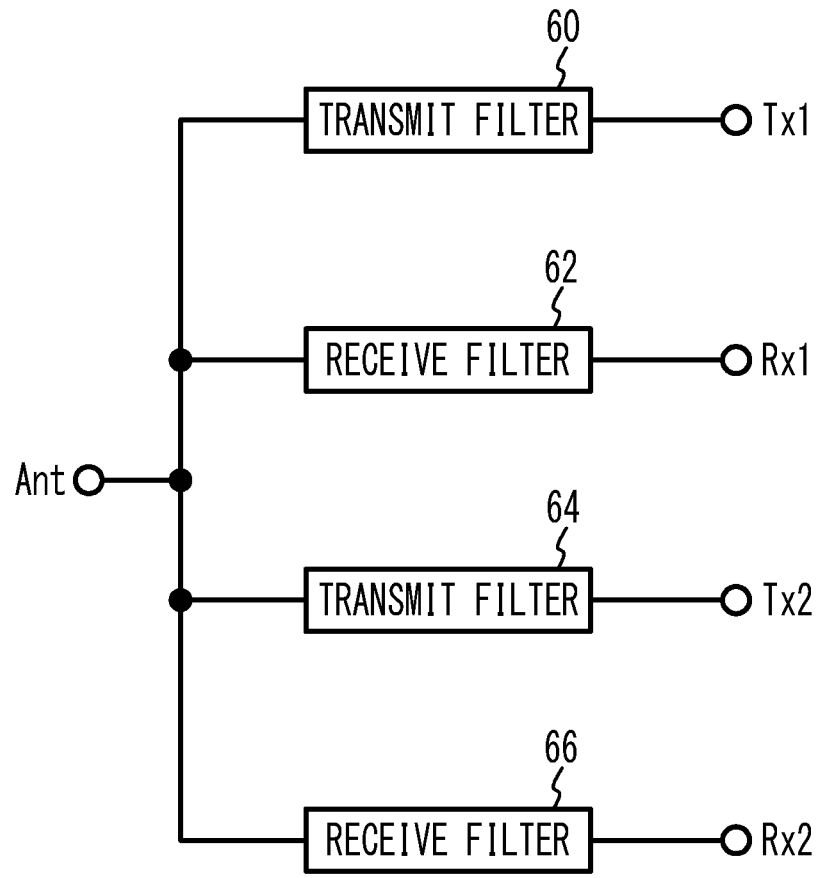
FIG. 3A is a circuit diagram of a multiplexer in accordance with the first embodiment.
Figure 3B:
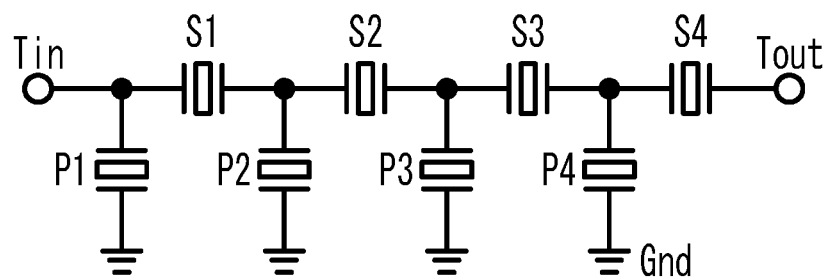
FIG. 3B is a circuit diagram of a filter in the multiplexer.

FIG. 3A is a circuit diagram of a multiplexer in accordance with a first embodiment, and FIG. 3B is a circuit diagram of a filter in the multiplexer.

As illustrated in FIG. 3A, a transmit filter 60 is connected between a common terminal Ant and a transmit terminal Tx1, a receive filter 62 is connected between the common terminal Ant and a receive terminal Rx1, a transmit filter 64 is connected between the common terminal Ant and a transmit terminal Tx2, and a receive filter 66 is connected between the common terminal Ant and a receive terminal Rx2. The transmit filter 60 and the receive filter 62 are for the same band of, for example, the frequency division duplex (FDD) system, and transmit and receive high-frequency signals simultaneously. The transmit filter 64 and the receive filter 66 are for the same band of, for example, the FDD system, and transmit and receive high-frequency signals simultaneously. The transmit filter 60 transmits signals in the passband to the common terminal Ant among high-frequency signals input to the transmit terminal Tx1, and suppresses signals in other frequency bands. The transmit filter 64 transmits signals in the passband to the common terminal Ant among high-frequency signals input to the transmit terminal Tx2, and suppresses signals in other frequency bands. The receive filter 62 transmits signals in the passband to the receive terminal Rx1 among high-frequency signals input to the common terminal Ant, and suppresses signals in other frequency bands. The receive filter 66 transmits signals in the passband to the receive terminal Rx2 among high-frequency signals input to the common terminal Ant, and suppresses signals in other frequency bands.

As illustrated in FIG. 3B, the transmit filters 60 and 64 and the receive filters 62 and 66 are, for example, ladder-type filters. Series resonators S1 to S4 are connected in series between an input terminal Tin and an output terminal Tout. Parallel resonators P1 to P4 are connected in parallel between the input terminal Tin and the output terminal Tout. First ends of the parallel resonators P1 to P4 are connected to the series path between the input terminal Tin and the output terminal Tout, while second ends of the parallel resonators P1 to P4 are connected to respective ground terminals Gnd. The series resonators S1 to S4 and the parallel resonators P1 to P4 are, for example, acoustic wave resonators. At least one filter selected from a group consisting of the transmit filters 60 and 64 and the receive filters 62 and 66 may be a multimode type filter.

As illustrated in FIG. 1B, the transmit filter 60, the transmit filter 64, the receive filter 62, and the receive filter 66 are disposed on the lower surfaces of the four substrates 20, respectively. As illustrated in FIG. 1C, the terminals 18b correspond to the transmit terminals Tx1 and Tx2 and the receive terminals Rx1 and Rx2. The terminal 18c corresponds to the common terminal Ant. The terminal 18d is a ground terminal Gnd shared by the transmit filters 60 and 64 and the receive filters 62 and 66.

Figure 4A:
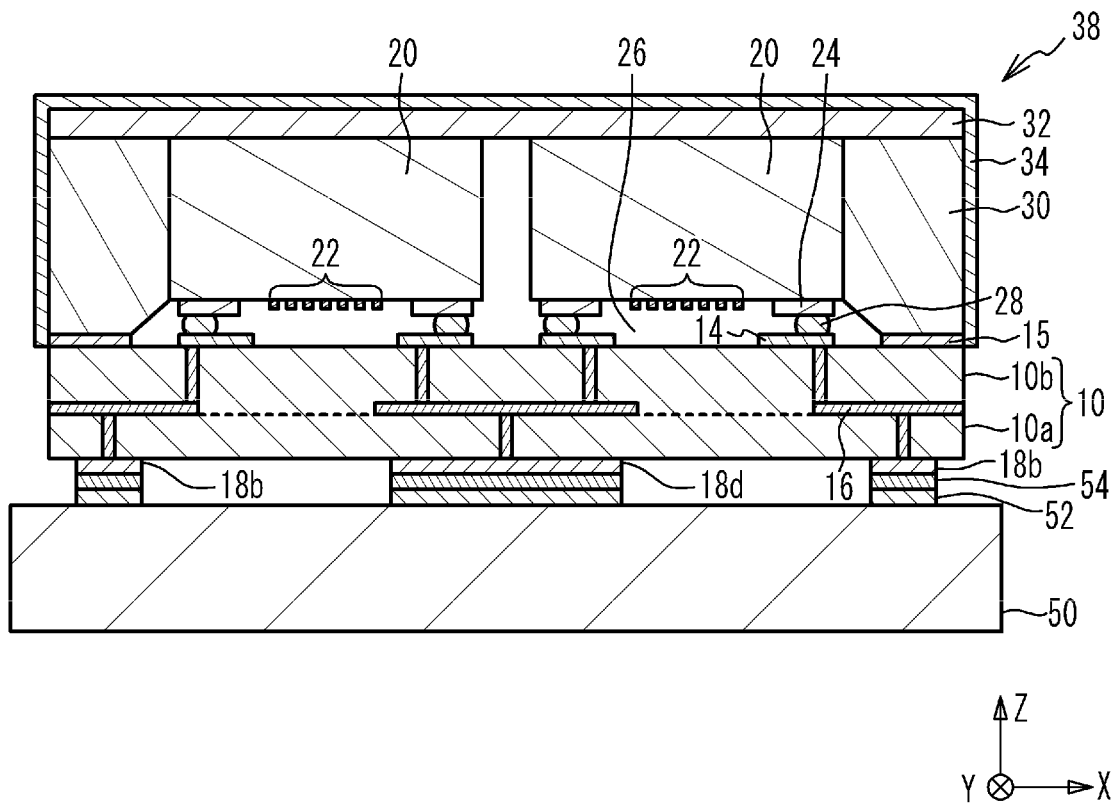
FIG. 4A and FIG. 4B are a cross-sectional view and a plan view of a module in which the electronic component in accordance with the first embodiment is mounted on a mounting board, respectively.
Figure 4B:
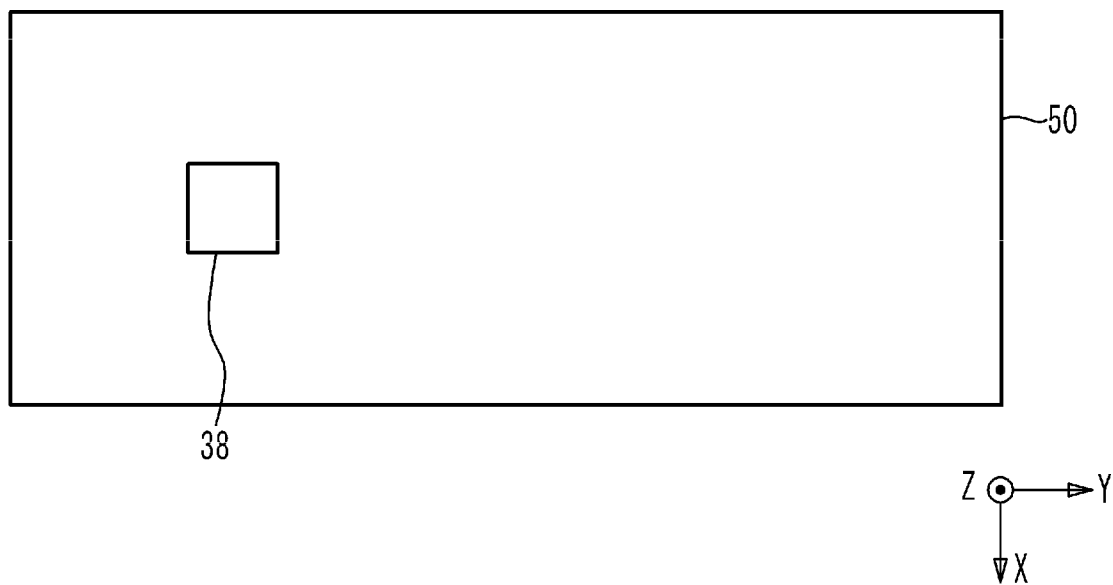

FIG. 4A is a cross-sectional view of a module in which the electronic component of the first embodiment is mounted on a mounting board, and FIG. 4B is a plan view of the module. As illustrated in FIG. 4A, in a communication module, pads 52 are located on the upper surface of a mounting board 50. The pads 52 are bonded to the terminals 18a to 18d (the terminals 18a and 18c are not illustrated) through bonding layers 54. The bonding layer 54 is a solder layer such as, for example, tin silver copper. As illustrated in FIG. 4B, the electronic component 38 is mounted on the upper surface of the mounting board 50. The mounting board 50 is a resin substrate made of such as, but not limited to, glass epoxy resin. The pad 52 is a metal layer such as, but not limited to, a copper layer, a gold layer, or an aluminum layer.

First Comparative Example

Figure 5:
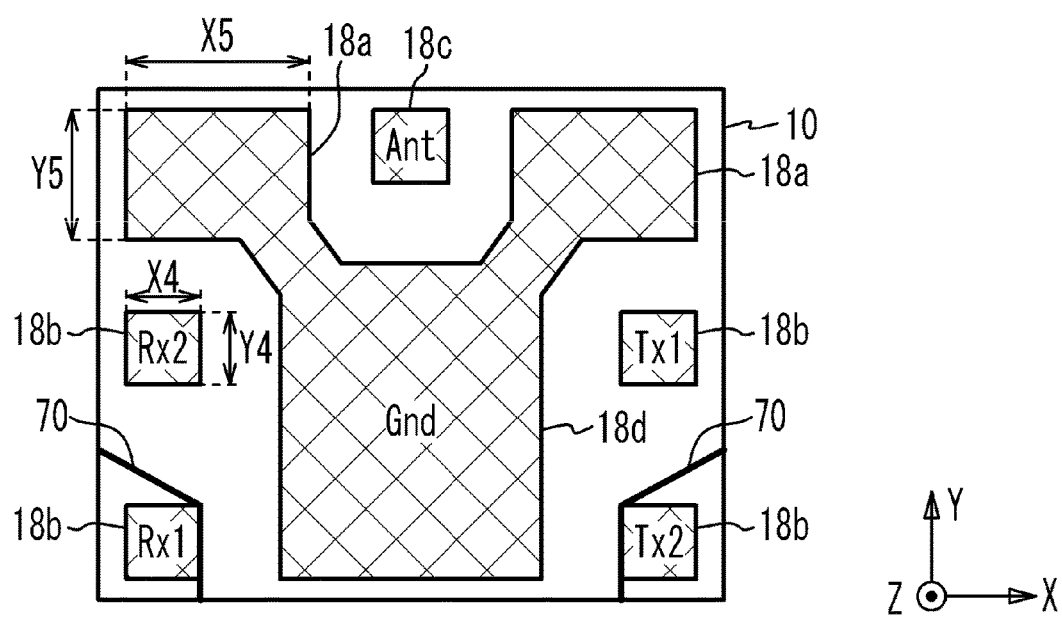
FIG. 5 is a plan view of an electronic component in accordance with a first comparative example.

FIG. 5 is a plan view of an electronic component in accordance with a first comparative example. As illustrated in FIG. 5, in the first comparative example, the terminals 18a are located adjacent to two corners of four corners of the lower surface of the substrate 10. The terminals 18b are located adjacent to other two corners. That is, the terminals adjacent to two corners of four corners are the terminals 18b having a smaller area.

The electronic component of the first comparative example was mounted on the mounting board 50 as illustrated in FIG. 4A and FIG. 4B, and was then subjected to a free-fall drop test. The free-fall drop test is a test in which a test object is dropped from a height of 1.8 m to a concrete floor. The material and the dimensions of each member of the first comparative example are the same as those in a simulation described later.

When the electronic components are subjected to the free-fall drop test, there is an electronic component in which a crack 70 is formed in the substrate 10 as illustrated in FIG. 5. The crack 70 is formed in two corners where the terminals 18b having a smaller area than the terminal 18a are located among four corners. As seen above, the resistance to shock is low in the first comparative example. The free-fall drop test is merely an example. In the first comparative example, when a shock is applied to the terminals 18a to 18d, the substrate 10 is likely to be damaged. Considered as a method of improving the resistance to shock in the free-fall drop test is providing an underfill material in the air gap between the mounting board 50 and the substrate 10. However, since the step of providing the underfill material is added, the number of manufacturing steps increases. In addition, even when the underfill material is provided, the terminals 18a to 18c are subjected to shock.

Simulation 1

Figure 6A:
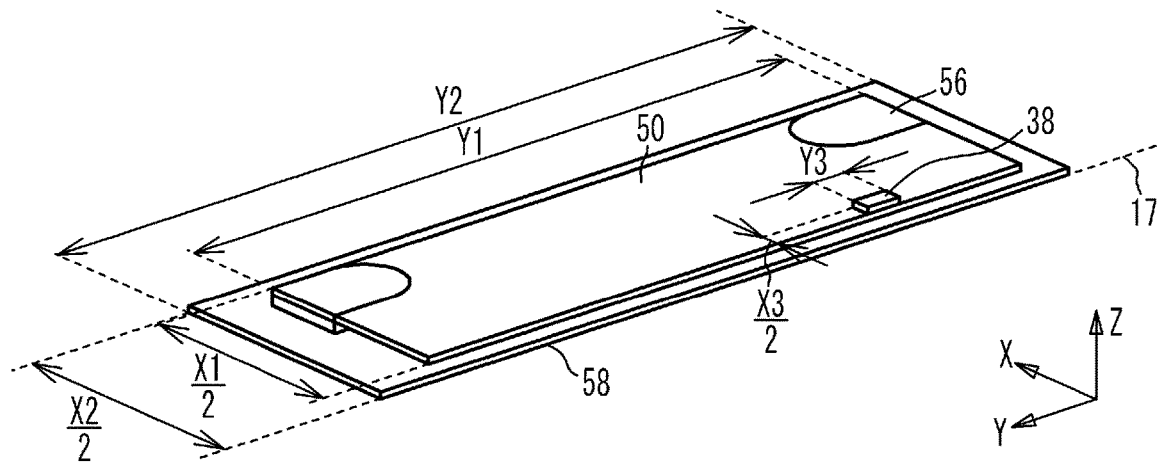
FIG. 6A is a perspective view of a mounting board and a floor in a simulation 1.

Simulated was a shock applied to the substrate 10 of the electronic component 38 when the mounting board 50 is caused to fall freely. FIG. 6A is a perspective view of a mounting board and a floor in a simulation 1, FIG. 6B is a cross-sectional view of the mounting board and the floor, and FIG. 6C is a cross-sectional view of the mounting board and a substrate.

Figure 6B:
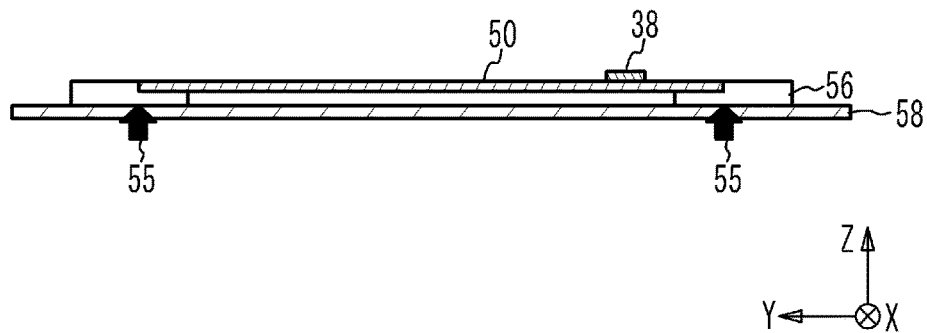
FIG. 6B is a cross-sectional view of the mounting board and the floor.

As illustrated in FIG. 6A and FIG. 6B, in the simulation 1, a 1/2 symmetrical model that is symmetric with respect to the YZ plane including a dashed straight line 17 was used. The width of the mounting board 50 in the X direction is X1, and the width of the mounting board 50 in the Y direction is Y1. The width of a floor 58 in the X direction is X2, and the width of the floor 58 in the Y direction is Y2. The width of the electronic component 38 in the X direction is X3, and the width of the electronic component 38 in the Y direction is Y3. A jig 56 is fixed to the +X end of each of the two sides extending in the X direction of the mounting board 50. Since the model is line-symmetric with respect to the YZ plane including the dashed straight line 17, in the simulation 1, the width of the mounting board 50 in the X direction is X1/2, the width of the floor 58 in the X direction is X2/2, and the width of the substrate 10 in the X direction is X3/2.

Figure 6C:
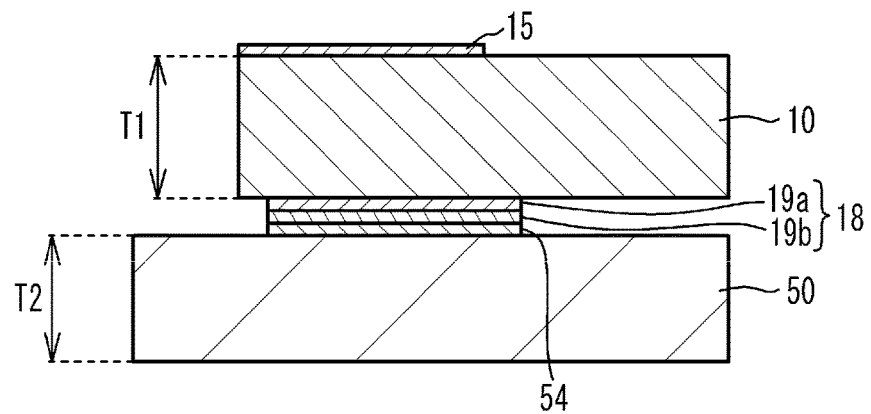
FIG. 6C is a cross-sectional view of the mounting board and a substrate.

As illustrated in FIG. 6C, a terminal 18 is bonded to the upper surface of the mounting board 50 through the bonding layer 54. The terminal 18 includes a layer 19a located on the lower surface of the substrate 10, and a layer 19b located on the lower surface of the layer 19a. The ring-shaped metal layer 15 is located on the upper surface of the substrate 10. No layers other than the metal layer 15 are located on the substrate 10.

Conditions in the simulation 1 are as follows.
Electronic component 38:
    Width X3: 2.5 mm
    Width Y3: 2.0 mm
    Substrate 10: LTCC substrate with a thickness T1 of 0.33 mm
    Metal layer 15: Copper layer with a thickness of 15 μm
    Layer 19a: Copper layer with a thickness of 15 μm
    Layer 19b: Nickel layer with a thickness of 15 μm Mounting board 50:
  Width X1: 25 mm
  Width Y1: 37 mm
  Mounting board 50: Glass epoxy substrate with a thickness T2 of 0.4 mm
  Jig 56: Stainless steel
  Bonding layer 54: Tin silver copper with a thickness of 20 μm
Floor 58:
  Width X2: 31 mm
  Width Y2: 43 mm
  Floor 58: Concrete with a thickness of 0.4 mm
  Impact speed: 5939.7 mm/s, Assume a drop from a height of 1.8 m
  Boundary condition: Assume that the lower surface and three side surfaces of the floor 58 are fixed, and the symmetrical boundary face is supported without friction.

Table 1 lists the density, Young's modulus, and Poisson ratio of each material used in the simulation 1.

TABLE 1

| | Glass epoxy | Stainless steel | Concrete | LTCC | Copper | Nickel | Tin silver copper |
|---|---|---|---|---|---|---|---|
| Density [kg/m³] | 2100 | 7750 | 2300 | 2900 | 8960 | 8900 | 7360 |
| Young's modulus [GPa] | 28 | 193 | 30 | 105 | 77 | 207 | 40.1 |
| Poisson ratio | 0.2 | 0.31 | 0.18 | 0.23 | 0.343 | 0.31 | 0.3 |

The stress on the lower surface of the substrate 10 when an impactive force is applied to the jigs 56 from the floor 58 as indicated by arrows 55 in FIG. 6B was simulated. A sample A corresponds to the first comparative example, and samples B to D correspond to the first embodiment.

FIG. 7A to FIG. 7D are plan views of the lower surfaces of the substrates in the samples A to D, respectively. Since a 1/2 symmetrical model is used, FIG. 7A to FIG. 7D correspond to the half of the lower surface of the substrate 10, and the lower surface of the actual substrate 10 is line-symmetric with respect to the dashed straight line 17.

Figure 7A:
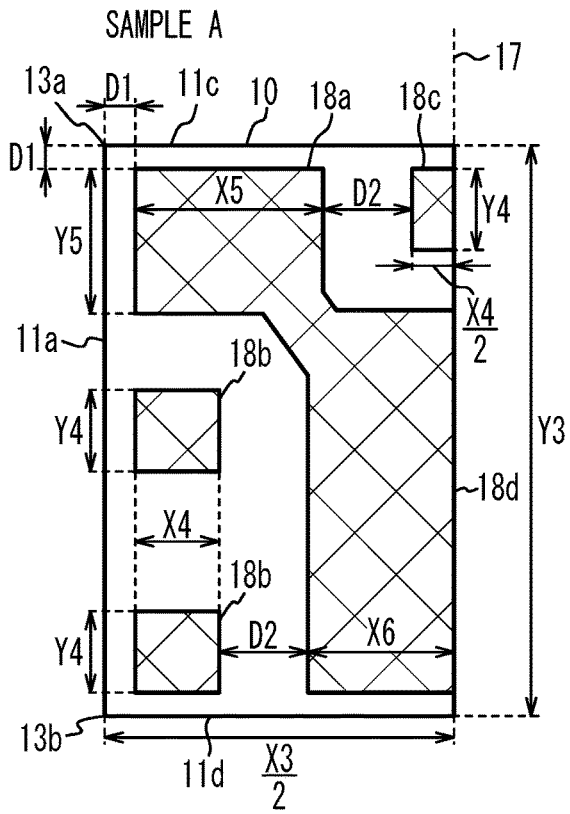
FIG. 7A to FIG. 7D are plan views of the lower surfaces of the substrates in samples A to D, respectively.
Figure 7B:
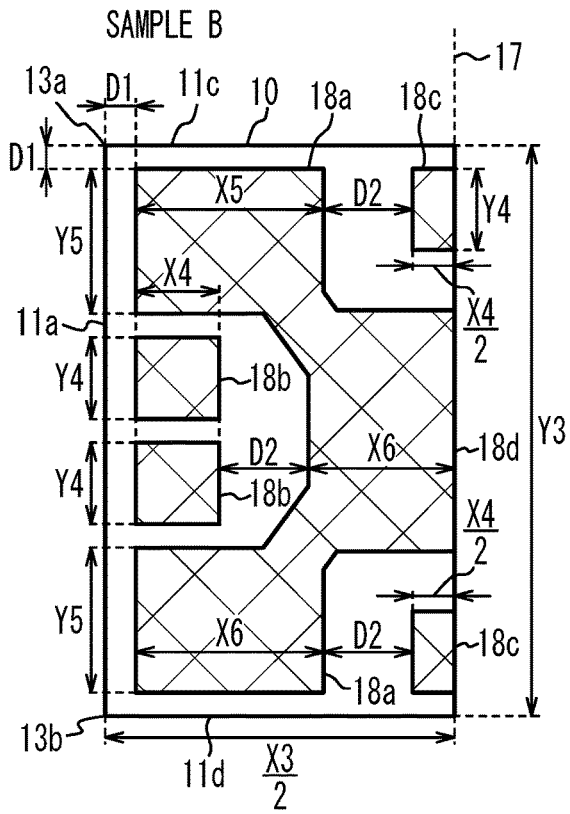
Figure 7C:
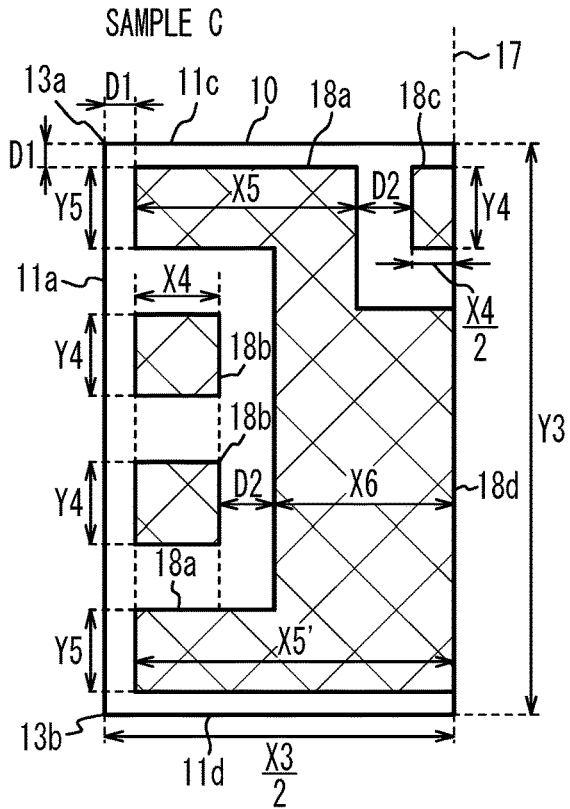
Figure 7D:
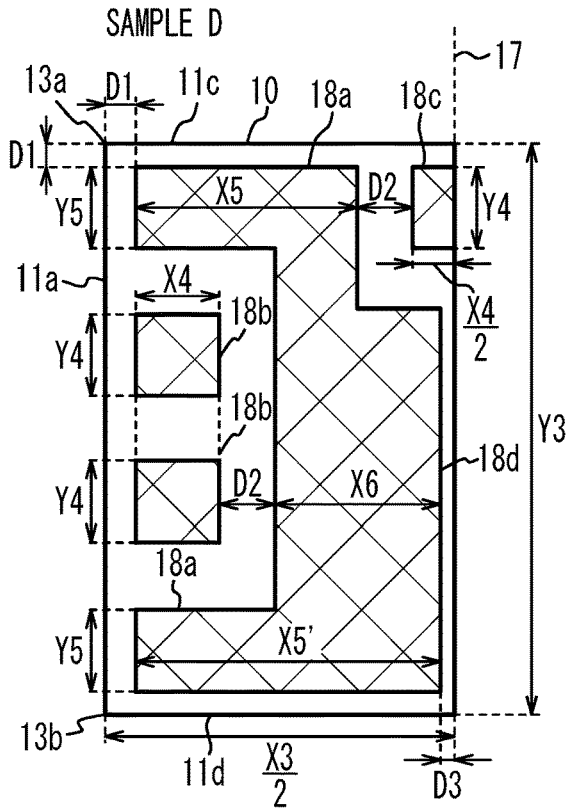

As illustrated in FIG. 7A, in the sample A, the terminal 18a is located adjacent to the corner 13a. The terminal 18b smaller than the terminal 18a is located adjacent to the corner 13b. A half of the terminal 18c is located adjacent to the side 11c. No terminal 18c is located on the side 11d. The widths X4 and Y4 of the terminal 18b and the widths X5 and Y5 of the terminal 18a, the X6 of the terminal 18d, the intervals D1 between the sides 11a, 11c, and 11d of the substrate 10 and the terminals 18a to 18c, and the intervals D2 between the terminal 18a and the terminal 18b and between the terminal 18a and the terminal 18c are as follows. X4=0.3 mm, Y4=0.3 mm, X5=0.7 mm, Y5=0.45 mm, X6=0.55 mm, D1=0.1 mm, and D2=0.3 mm As illustrated in FIG. 7B, in the sample B, the terminals 18a are located adjacent to the corners 13a and 13b at respective ends of the side 11a. Two terminals 18b are arranged in the Y direction between the terminals 18a in the Y direction. A half of the terminal 18c is located adjacent to the side 11c, and a half of another terminal 18c is located adjacent to the side 11d. Each dimension is as follows. X4=0.3 mm, Y4=0.3 mm, X5=0.7 mm, Y5=0.45 mm, X6=0.55 mm, D1=0.1 mm, and D2=0.3 mm As illustrated in FIG. 7C, in the sample C, the terminals 18a are located adjacent to the corners 13a and 13b at respective ends of the side 11a. The width Y5 of the terminal 18a in the Y direction is equal to the width Y4 of each of the terminals 18b and 18c in the Y direction. No terminal 18c is located adjacent to the side 11d, and the terminal 18a is located along the side 11d. Other structures are the same as those of the sample B. Each dimension is as follows. X4=0.3 mm, Y4=0.3 mm, X5=0.8 mm, X5'=1.15 mm, Y5=0.3 mm, X6=0.65 mm, D1=0.1 mm, and D2=0.2 mm As illustrated in FIG. 7D, in the sample D, the terminal 18d is located away from the dashed straight line 17. Other structures are the same as those of the sample C. Each dimension is as follows. X4=0.3 mm, Y4=0.3 mm, X5=0.8 mm, X5'=1.075 mm, Y5=0.3 mm, X6=0.575 mm, D1=0.1 mm, D2=0.2 mm, and D3=0.075 mm FIG. 8A to FIG. 8D illustrate the stress on the lower surface of the substrate in the samples A to D, respectively. In FIG. 8A to FIG. 8D, the region where the stress is small is indicated by light-color, while the region where the stress is large is indicated by dark-color. In all samples, the stress is largest near the corner 13b as indicated by the tip of an arrow 59. The terminals 18a and 18b near the tip of the arrow 59 are the terminals physically closest to the jig 56 in FIG. 6B. Thus, it is considered that the stress is applied to the lower surface of the substrate 10 most through the bonding layer 54 and the terminal 18 in FIG. 6C.

Figure 8A:
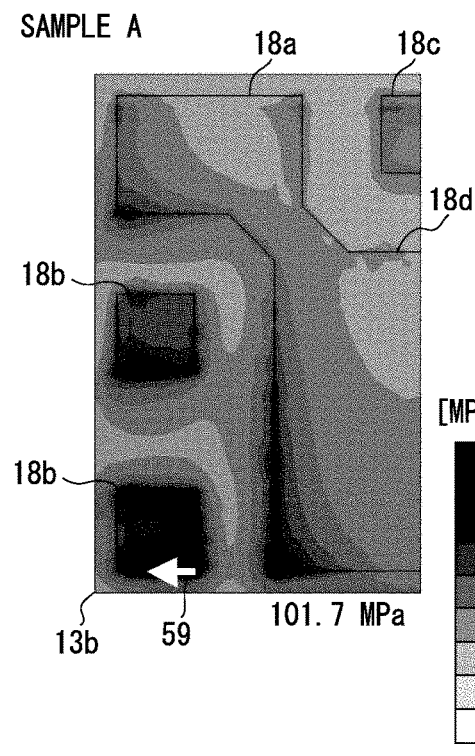
FIG. 8A to FIG. 8D illustrate a stress on the lower surface of the substrate in the samples A to D, respectively.

As illustrated in FIG. 8A, the stress around the terminal 18b adjacent to the corner 13b is largest. The largest value of the stress on the lower surface of the substrate 10 is 101.7 MPa. The location in which the stress is concentrated substantially agrees with the location where the crack 70 is generated in FIG. 5. As seen above, the resistance to shock of the electronic component can be predicted through the simulation 1.

Figure 8B:
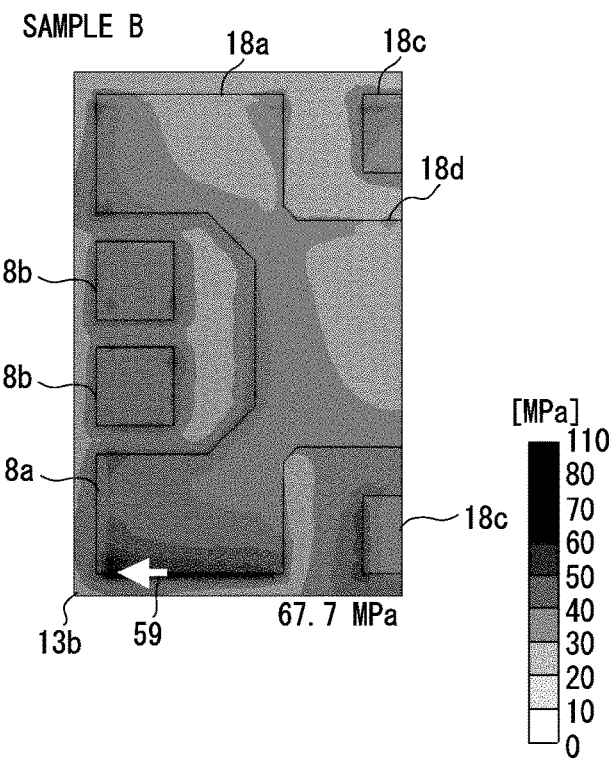

As illustrated in FIG. 8B, when the terminal 18a near the arrow 59 is configured to be larger than the terminal 18b as in the sample B, the largest stress on the lower surface of the substrate 10 is 67.7 MPa, which is less than that of the sample A.

Figure 8C:
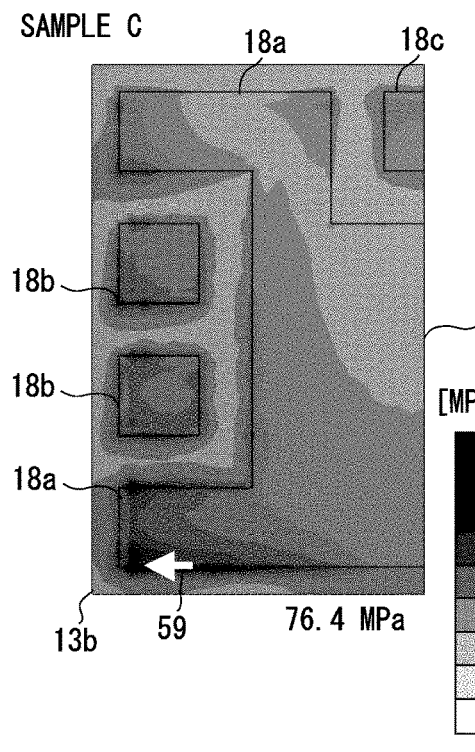

As illustrated in FIG. 8C, in the sample C, the width Y5 of the terminal 18a near the arrow 59 in the Y direction is equal to the width Y4 of the terminal 18b in the Y direction, but the width X5' of the terminal 18a near the arrow 59 in the X direction is greater than the width X4 of the terminal 18b in the Y direction. The largest stress on the lower surface of the substrate 10 is 76.4 MPa, which is less than that of the sample A and greater than that of the sample B.

Figure 8D:
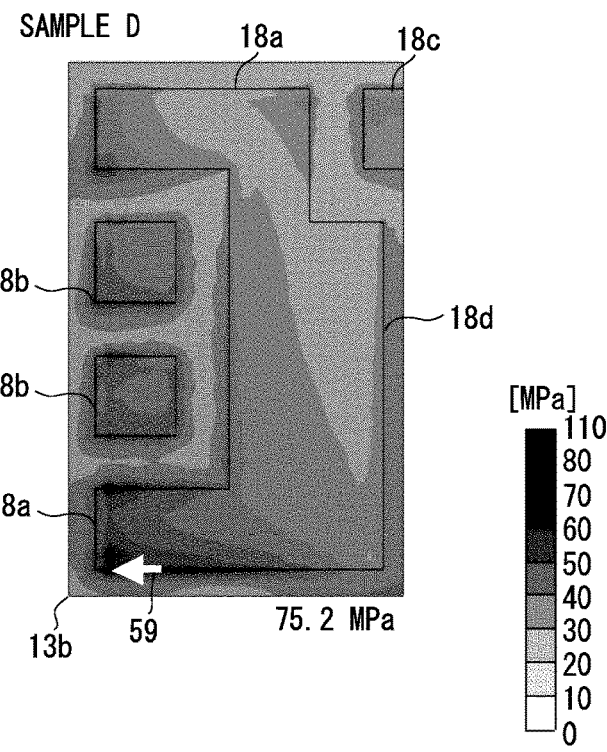

As illustrated in FIG. 8D, even when the terminal 18a of the sample C is located away from the dashed straight line 17 (see FIG. 7D) as in the sample D, the largest stress on the lower surface is 75.2 MPa, which is approximately equal to that of the sample C.

As seen in the simulation 1, the impact on the substrate 10 from the mounting board 50 through the terminal 18 is largest near the terminal 18a or 18b adjacent to the corner of the substrate 10. Thus, the area of the terminal 18a adjacent to the corner is configured to be larger than the areas of other terminals 18b and 18c. This configuration mitigates the shock applied to the substrate 10 from the terminal 18a adjacent to the corner 13b, and thereby improves the resistance to shock. When the width Y5 of the terminal 18a is configured to be greater than the width Y4 of the terminal 18b as in the sample B, the resistance to shock is further improved.

Simulation 2

Figure 9A:
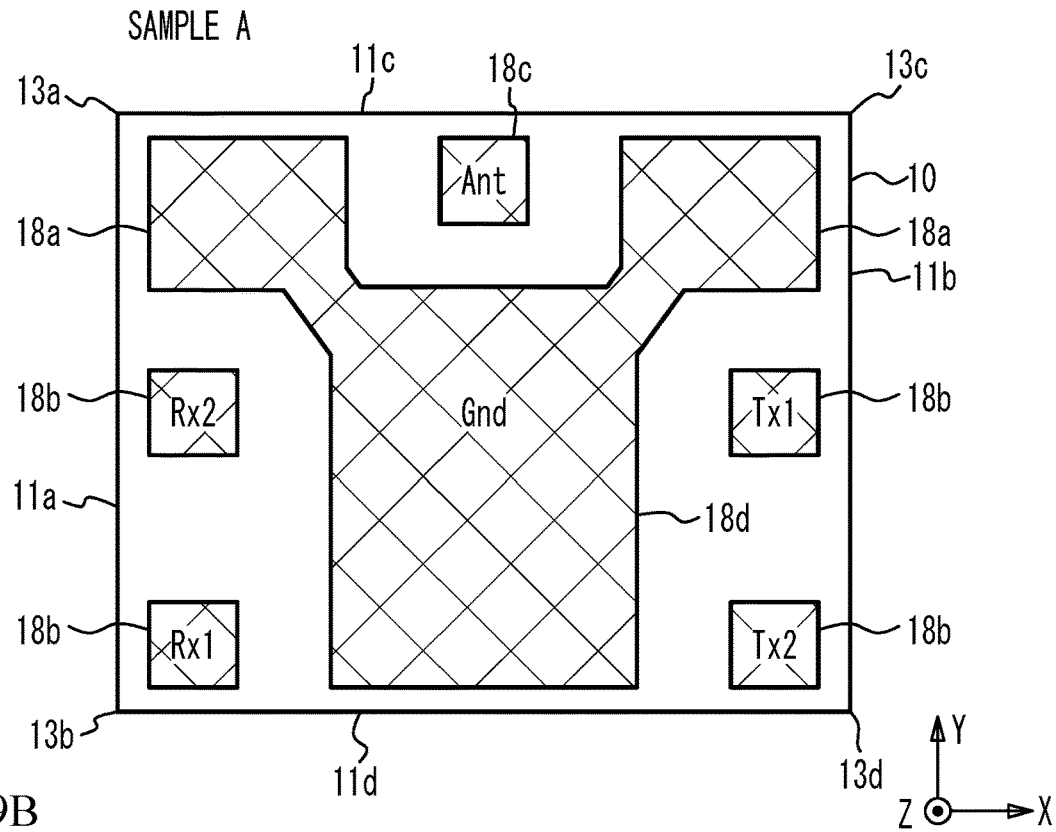
FIG. 9A and FIG. 9B are plan views of the lower surfaces of the substrates of the samples A and D, respectively.
Figure 9B:
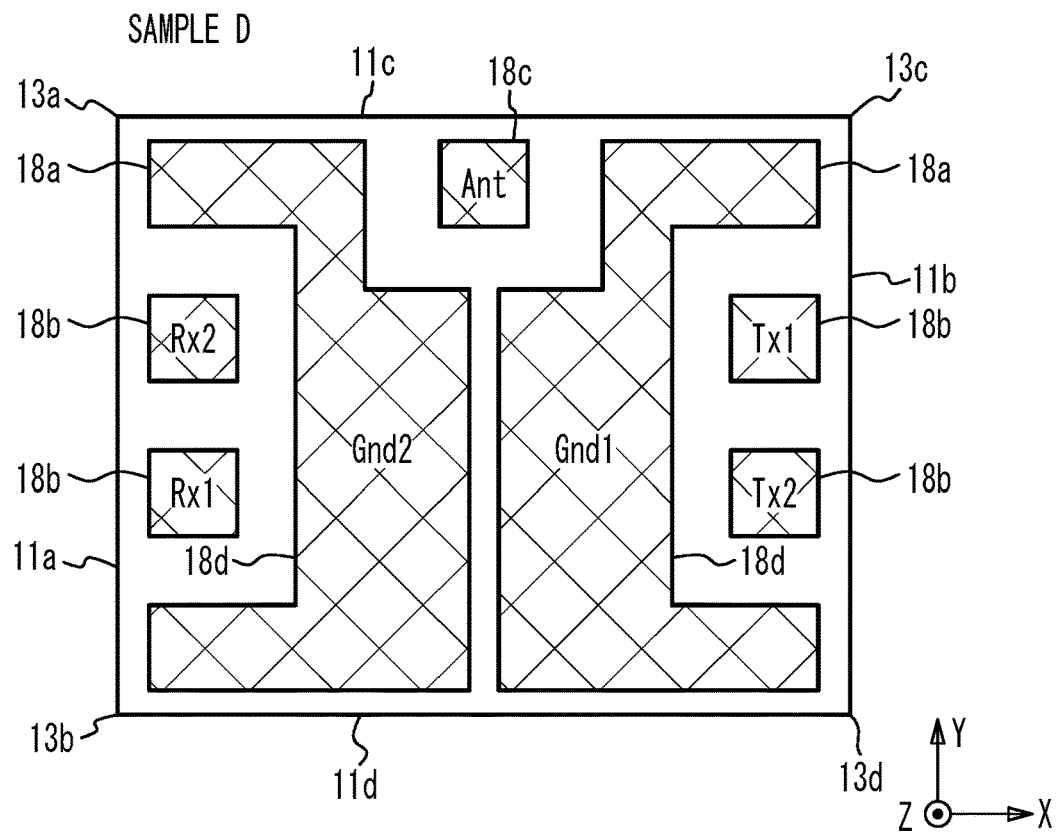

The isolation characteristic of the multiplexer was simulated for each of the samples A and D. FIG. 9A and FIG. 9B are plan views of the lower surfaces of the substrates of the samples A and D, respectively. As illustrated in FIG. 9A, in the sample A, the terminal 18*b* as the receive terminal Rx1 is located adjacent to the corner 13*b*, and the terminal 18*b* as the transmit terminal Tx2 is located adjacent to the corner 13*d*. The terminal 18*b* as the receive terminal Rx2 is located near the center of the side 11*a*, and the terminal 18*b* as the transmit terminal Tx1 is located near the center of the side 11*b*. Grounds of the transmit filters 60 and 64 and the receive filters 62 and 66 are connected to one ground terminal Gnd.

As illustrated in FIG. 9B, in the sample D, the terminal 18*d* is divided in the middle in the X direction. The grounds of the transmit filters 60 and 64 are connected to a ground terminal Gnd1, and the grounds of the receive filters 62 and 66 are connected to a ground terminal Gnd2. The ground terminals Gnd1 and Gnd2 are electrically separated from each other in the substrate 10.

Each of the transmit filters 60 and 64 and the receive filters 62 and 66 is a ladder-type filter including the surface acoustic wave resonator illustrated in FIG. 2A. It was assumed that the transmit filter 60 and the receive filter 62 were the filters for the long term evolution (LTE) Band3 (the transmit band: 1710 MHz to 1785 MHz, the receive band: 1805 MHz to 1880 MHz), and the transmit filter 64 and the receive filter 66 were the filters for the LTE Band1 (the transmit band: 1920 MHz to 1980 MHz, the receive band: 2110 MHz to 2170 MHz).

Figure 10A:
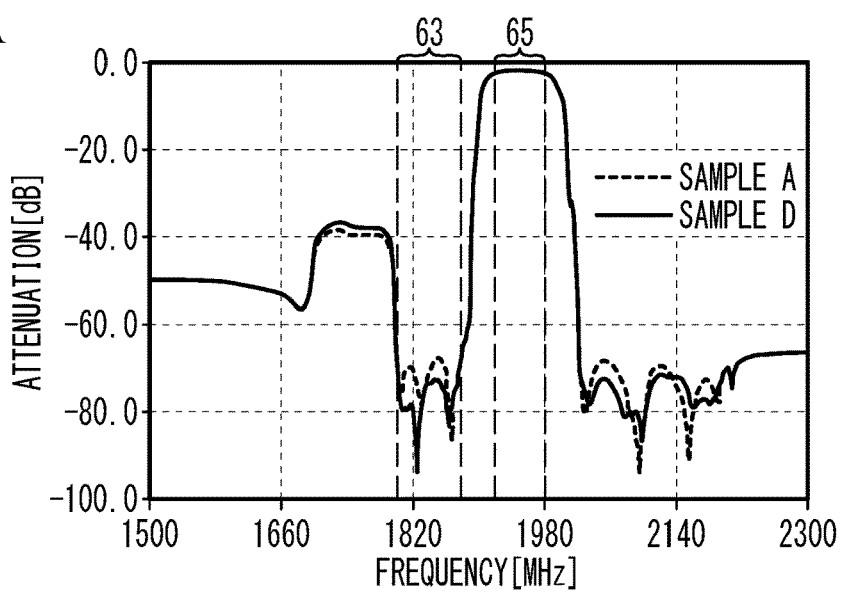
FIG. 10A and FIG. 10B illustrate transmission characteristics of a transmit filter 64 and a receive filter 62, respectively.
Figure 10B:
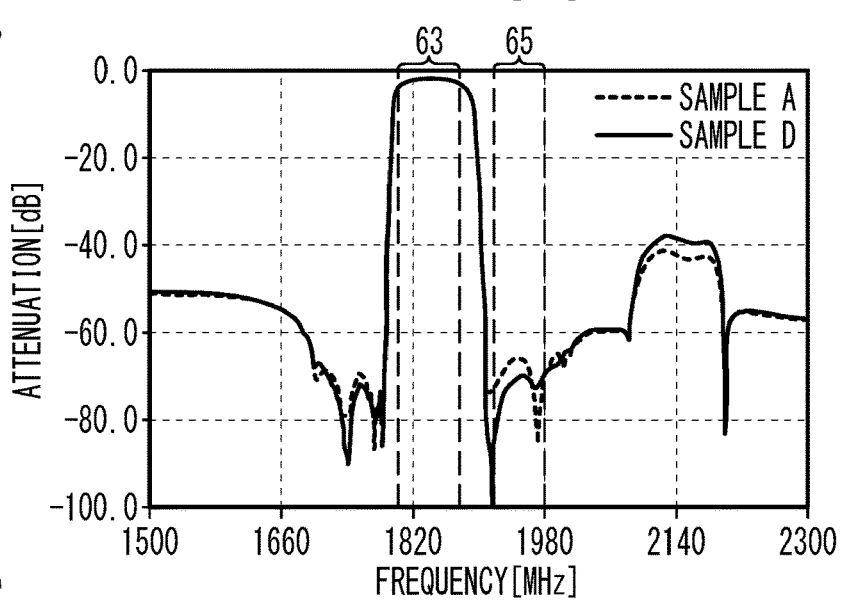
Figure 10C:
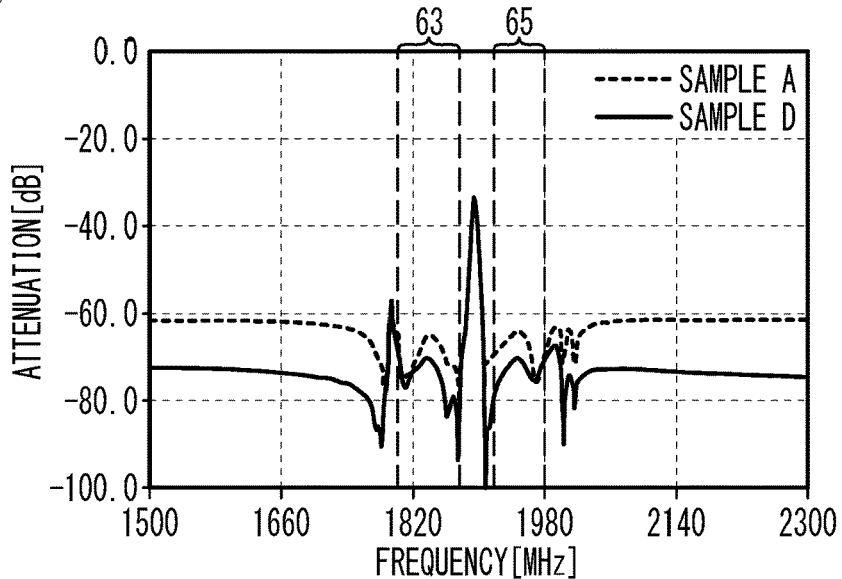
FIG. 10C illustrates an isolation characteristic between the transmit terminal Tx2 of the transmit filter 64 and the receive terminal Rx1 of the receive filter 62.

FIG. 10A and FIG. 10B illustrate the transmission characteristics of the transmit filter 64 and the receive filter 62, respectively, and FIG. 10C illustrates the isolation characteristic between the transmit terminal Tx2 of the transmit filter 64 and the receive terminal Rx1 of the receive filter 62. In FIG. 10A to FIG. 10C, a receive band 63 of Band1 and a transmit band 65 of Band3 are indicated.

As illustrated in FIG. 10A, the transmission characteristic of the transmit filter 64 is substantially the same between the samples A and D. The attenuation in the receive band 63 in the sample D is less than that in the sample A.

As illustrated in FIG. 10B, the transmission characteristic of the receive filter 62 is substantially the same between the samples A and D. The attenuation in the transmit band 65 in the sample D is less than that in the sample A.

As illustrated in FIG. 10C, the isolation between the transmit terminal Tx2 of the transmit filter 64 and the receive terminal Rx1 of the receive filter 62 in the sample D is improved more than that in the sample A.

As in the simulation 2, the terminal 18*d* is divided into the ground terminals Gnd1 and Gnd2. This structure reduces the leakage of signals between the transmit filter (60 and 64) and the receive filter (62 and 66) through the ground terminals Gnd1 and Gnd2. Thus, the isolation between the transmit filter (60 and 64) and the receive filter (62 and 66) is improved.

FIG. 11A to FIG. 11D are plan views illustrating the lower surface of the substrate in the first embodiment. As illustrated in FIG. 11A, the terminals 18*a* at respective ends of the side 11*d* are interconnected along the side 11*d*, and no terminal 18*c* is located adjacent to the side 11*d*. Other structures are the same as those of the first embodiment illustrated in FIG. 1C, and the description thereof is thus omitted.

As illustrated in FIG. 11B, the four terminals 18*a* are not interconnected on the lower surface of the substrate 10. The terminal 18*d* is located in the center of the substrate 10. In FIG. 11B, since the terminals 18*a* are not interconnected, the terminals 18*a* may be used as a terminal to which high-frequency signals are input such as the receive terminal or a terminal from which high-frequency signals are output such as the transmit terminal. As seen above, the terminals 18*a* to 18*d* may be ground terminals, or may be terminals to or from which high-frequency signals are input or output. Other structures are the same as those of the first embodiment illustrated in FIG. 1C, and the description thereof is thus omitted. As illustrated in FIG. 11C, the terminal 18*d* in the center of the substrate 10 may be omitted. Other structures are the same as those illustrated in FIG. 11B, and the description thereof is thus omitted. As illustrated in FIG. 11D, the terminals 18*b* may be arranged in the X direction. Other structures are the same as those of FIG. 11A, and the description thereof is thus omitted.

Second Embodiment

Figure 12A:
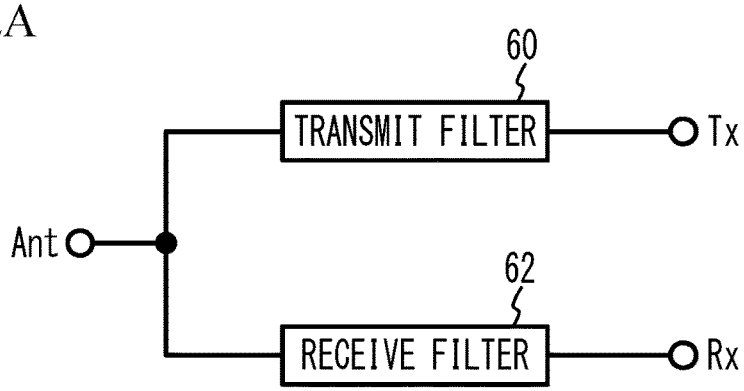
FIG. 12A is a circuit diagram of a multiplexer in accordance with a second embodiment.

A second embodiment is an exemplary duplexer as an example of the multiplexer. FIG. 12A is a circuit diagram of a multiplexer in accordance with a second embodiment, and FIG. 12B and FIG. 12C are plan views of the acoustic wave device.

As illustrated in FIG. 12A, the transmit filter 60 is connected between the common terminal Ant and a transmit terminal Tx, and the receive filter 62 is connected between the common terminal Ant and a receive terminal Rx. The transmit filter 60 transmits signals in the passband to the common terminal Ant among high-frequency signals input to the transmit terminal Tx, and suppresses signals in other frequency bands. The receive filter 62 transmits signals in the passband to the receive terminal Rx among high-frequency signals input to the common terminal Ant, and suppresses signals in other frequency bands.

Figure 12B:
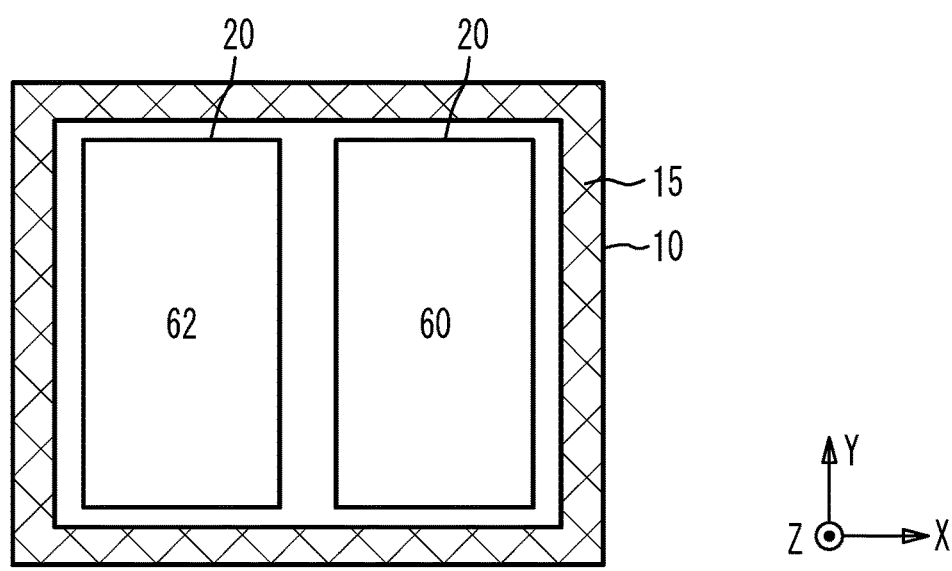
FIG. 12B and FIG. 12C are plan views of the acoustic wave device.
Figure 12C:
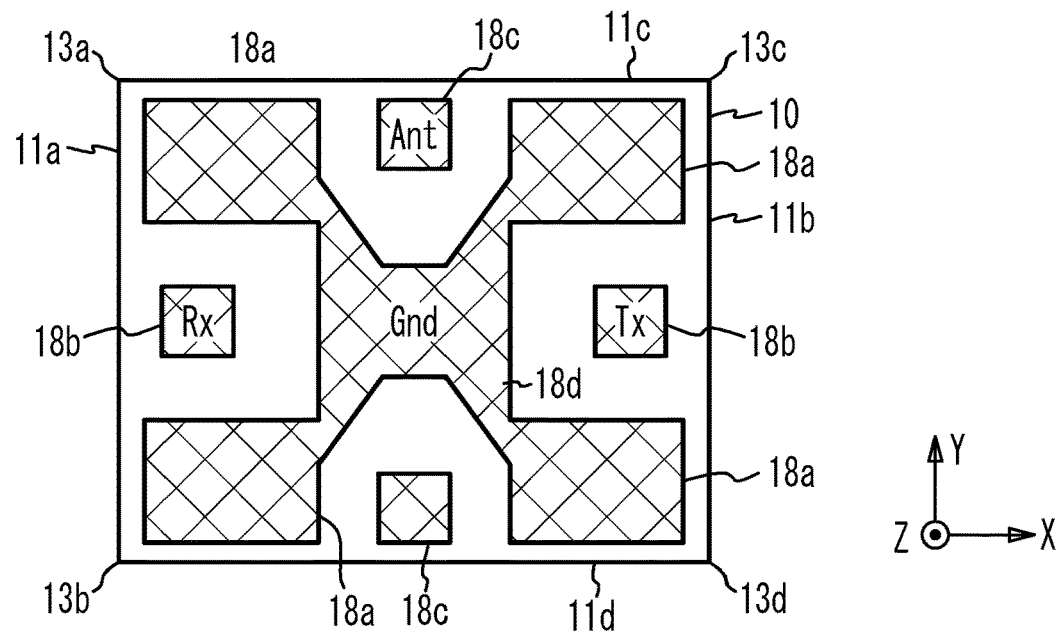

As illustrated in FIG. 12B, the transmit filter 60 is disposed on the lower surface of the substrate 20, and the receive filter 62 is disposed on the lower surface of another substrate 20. As illustrated in FIG. 12C, the terminals 18*b* correspond to the transmit terminal Tx and the receive terminal Rx. The terminal 18*c* corresponds to the common terminal Ant. The terminal 18*d* is the ground terminal Gnd shared by the transmit filter 60 and the receive filter 62.

Figure 13A:
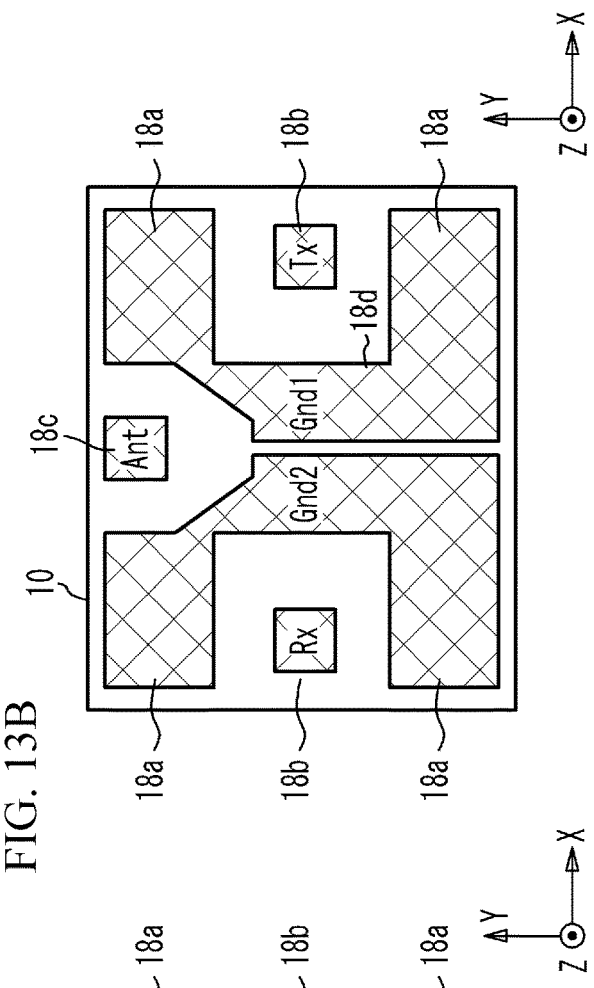
FIG. 13A to FIG. 13D are plan views illustrating the lower surface of the substrate in the second embodiment.

FIG. 13A to FIG. 13D are plan views of the lower surface of the substrate in the second embodiment. As illustrated in FIG. 13A, the terminals 18*a* at respective ends of the side 11*d* are interconnected along the side 11*d*, and no terminal 18*c* adjacent to the side 11*d* is provided. Other structures are the same as those illustrated in FIG. 12C, and the description thereof is thus omitted.

Figure 13B:
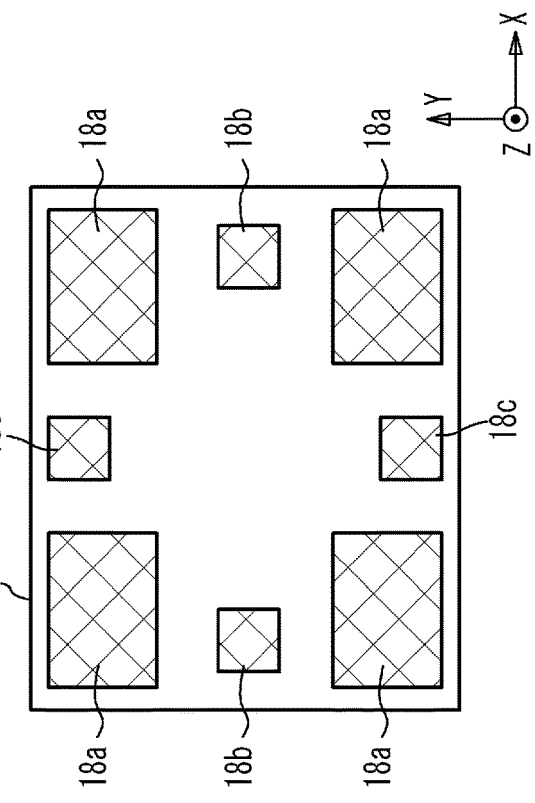

As illustrated in FIG. 13B, the ground terminal Gnd1 of the transmit filter 60 and the ground terminal Gnd2 of the receive filter 62 are electrically separated in the substrate 10. Other structures are the same as those of FIG. 13A, and the description thereof is thus omitted.

Figure 13C:
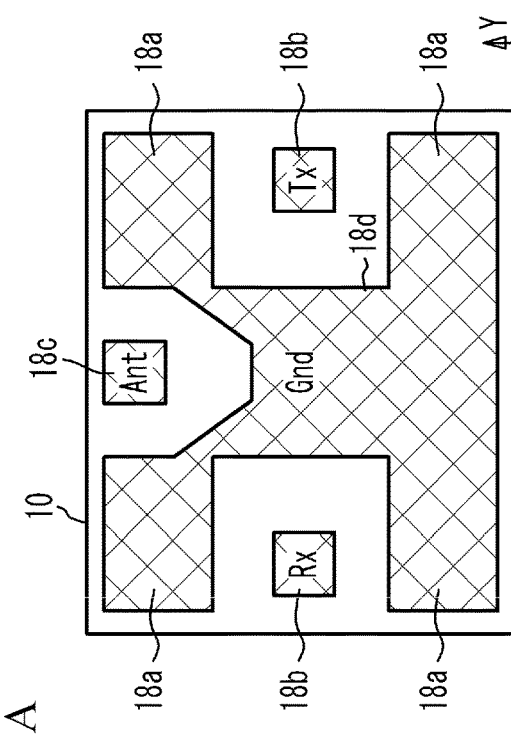
Figure 13D:
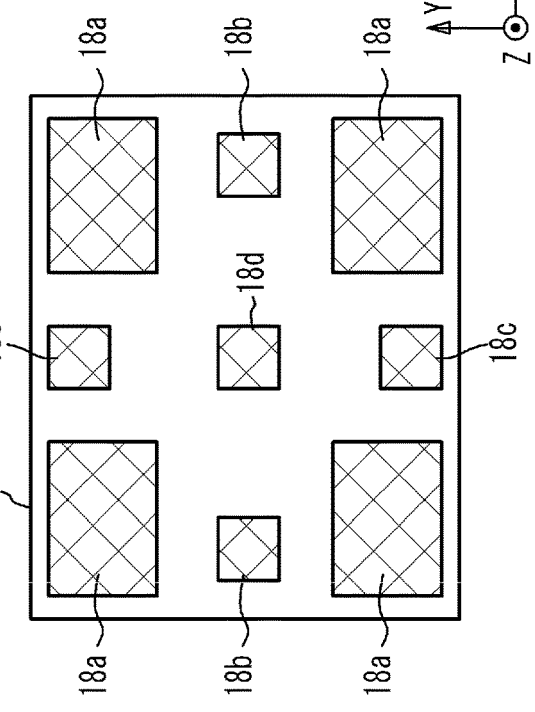

As illustrated in FIG. 13C, the four terminals 18*a* are not interconnected on the lower surface of the substrate 10. The terminal 18*d* is located in the center of the substrate 10. As illustrated in FIG. 13D, the terminal 18*d* in the center of the substrate 10 may be omitted. In FIG. 13C and FIG. 13D, since the terminals 18*a* are not interconnected, the terminals 18*a* may be used as a terminal to which high-frequency signals are input such as the receive terminal or a terminal from which high-frequency signals are output such as the transmit terminal. Other structures are the same as those of the second embodiment illustrated in FIG. 12C, and the description thereof is thus omitted.

In the first and second embodiments, the acoustic wave element 22 is disposed on the upper surface (a first surface) of the substrate 10 (a first substrate). The terminal 18a (a first terminal) and the terminal 18b (a second terminal) are located on the lower surface (a second surface opposite to the first surface) of the substrate 10. As illustrated in FIG. 1C, the four terminals 18a are located adjacent to four corners 13a to 13d on the lower surface of the substrate 10, respectively. The terminal 18b is located between the terminals 18a at respective ends of each of the two sides 11a and 11b, which are opposite to each other in the X direction, in the Y direction (in the extension direction of each of the sides 11a and 11b). The area of the terminal 18b is less than the area of each of the terminals 18a at respective ends of each of the sides 11a and 11b. The width Y4 of the terminal 18b in the Y direction (see FIG. 7A to FIG. 7D) is equal to or less than the width Y5 of the terminal 18a in the Y direction (see FIG. 7A to FIG. 7D).

As described above, since the terminal 18a is larger than the terminal 18b, even when a shock is applied to the terminal 18a, the largest stress applied to the lower surface of the substrate 10 is less than that in the first comparative example as described in the simulation 1. Therefore, a crack is inhibited from being formed in the substrate 10, the resistance to shock of the electronic component 38 is improved, and the reliability is thus improved.

The term "the terminal 18a is located adjacent to the corner 13a" means that no terminal is located between the terminal 18a and the corner 13a. The shortest distance between the terminal 18a and the side 11a and the shortest distance between the terminal 18a and the side 11c are equal to or less than, for example, the width Y5, which is the smaller width of the width X5 of the terminal 18a in the X direction and the width Y5 of the terminal 18a in the Y direction, and is equal to or less than, for example, Y5/2.

Additionally, as illustrated in FIG. 1C, the first side, which is opposite to the side 11a (i.e., the first side closer to the side 11a), of the terminal 18b is preferably arranged closer to the center of the lower surface of the substrate 10 than the first side, which is opposite to the side 11a (i.e., the first side closer to the side 11a), of the terminal 18a in the side 11a, and the first side, which is opposite to the side 11b (i.e., the first side closer to the side 11b), of the terminal 18b is preferably arranged closer to the center of the lower surface of the substrate 10 than the first side, which is opposite to the side 11b (i.e., the first side closer to the side 11b), of the terminal 18a in the side 11b. This structure causes a shock to be transmitted to the terminal 18a before transmitted to the terminal 18b when the shock is applied to the substrate 10 in the X direction and the Y direction, thereby distributing the shock applied to the terminal 18b to the terminals 18a and inhibiting the damage of the terminal 18b.

As in the samples B to D of the simulation 1, the terminals 18a at respective ends of at least one side of the sides 11a and 11b are interconnected on the lower surface of the substrate 10. This reduces the largest stress on the lower surface of the substrate 10 even when a shock is applied to the electronic component 38 from the terminal 18a. Therefore, the resistance to shock of the electronic component 38 is further improved. Additionally, as illustrated in FIG. 5 of the first comparative example, the crack 70 is likely to be formed so as to surround the terminal 18b adjacent to a corner. When the terminals 18a are interconnected by the terminal 18d as illustrated in FIG. 1C, for a crack surrounding the terminal 18a adjacent to the corner to be formed, the crack needs to cross the terminal 18d. Therefore, a crack is less likely to be formed. The terminals 18a at respective ends of each of the sides 11a and 11b are preferably interconnected on the lower surface of the substrate 10.

As in the first embodiment, a plurality of the terminals 18b is provided between the terminals 18a at respective ends of at least one of the sides 11a and 11b. Even when small terminals 18b are provided in plural, the resistance to shock is improved by providing the terminals 18b between the terminals 18a.

As in the sample B, the width Y5 of each of the terminals 18a at respective ends of at least one of the sides 11a and 11b in the Y direction is larger than the width Y4 of the terminal 18b in the Y direction. This structure reduces the largest stress compared with that in a case where the width Y4 of the terminal 18b is equal to the width Y5 of the terminal 18a as in the samples C and D. Therefore, the resistance to shock is improved. The width Y5 of each of the terminals 18a at respective ends of each of the sides 11a and 11b is preferably greater than the width Y4. The width Y5 is preferably equal to or greater than 1.1 times the width Y4, more preferably equal to or greater than 1.2 times the width Y4, further preferably equal to or greater than 1.5 times the width Y4.

As in the samples B to D, the width (X5 and X5') of each of the terminals 18a at respective ends of at least one of the sides 11a and 11b in the X direction (a direction perpendicular to the extension direction of each of the sides 11a and 11b) is greater than the width X4 of the terminal 18b in the X direction. This structure reduces the largest stress compared with the sample A even when the widths Y4 and Y5 are equal as in the samples C and D, and the resistance to shock is improved. The width (X5 and X5') of each of the terminals 18a at respective ends of each of the sides 11a and 11b is preferably greater than the width X4. The width X5 is preferably equal to or greater than 1.2 times the width X4, more preferably equal to or greater than 1.5 times the width X4, further preferably 2.0 times the width X4.

As in the first and second embodiments, the terminal 18c (a third terminal) is located between the terminals 18a at respective ends of at least one of the sides 11c and 11d other than the sides 11a and 11b in the extension direction of the sides 11c and 11d (the X direction). The area of the terminal 18c is less than the area of each of the terminals 18a at respective ends, and the width X4 in the X direction is equal to or less than the width X5 of the terminal 18a in the X direction. The resistance to shock is improved and the number of terminals is increased by providing the terminal 18c. The terminal 18c may be provided in each of the sides 11c and 11d, but the terminal 18c may be provided in the side 11c, and the terminal 18c may be omitted in the side 11d. The width X5 is preferably equal to or greater than 1.1 times the width X4, more preferably equal to or greater than 1.2 times the width X4, further preferably equal to or greater than 1.5 times the width X4.

The terminals 18a at respective ends of at least one side 11d of the sides 11c and 11d extend in the X direction and are interconnected, and no other terminals are located between the terminals at respective ends of the at least one side 11d of the sides 11c and 11d as in the samples B and C. This structure improves the impact strength. The terminal 18c may be provided in the side 11c, and the terminals 18a may be interconnected in the side 11d. This structure improves the impact strength at the side 11d. When a shock is asymmetrically applied as in the simulation 1, the side 11d is arranged at the side where the shock is larger. This structure increases the number of terminals and improves the resistance to shock.

The substrate 10 may be a ceramic substrate such as an LTCC substrate or a high temperature co-fire ceramics (HTCC) substrate, or a resin substrate. The ceramic substrate has a small transverse intensity, and when a shock in the Z direction is applied to the terminals 18a to 18c, a crack is easily formed. Unlike the HTCC substrate, multi-layer wiring is possible in the LTCC substrate, and it is easier to form a capacitor and an inductor in the substrate. However, the LTCC has a transverse intensity of approximately 250 MPa, while the HTCC has a transverse intensity of approximately 400 MPa. Thus, the transverse intensity of the LTCC is lower. Therefore, when the substrate 10 is an LTCC substrate, it is preferable that the terminal 18a adjacent to each of four corners is provided as in the first and second embodiments.

In the first and second embodiments, the acoustic wave element has been described as an example of the element, but the element may be a passive element such as an inductor or a capacitor, an active element including a transistor, or a micro electro mechanical systems (MEMS) element. Additionally, a case where the substrate 20 (a second substrate) having the acoustic wave element 22 disposed on the surface closer to the substrate 10 of the substrate 20 is flip-chip mounted on the substrate 10. However, the element may be mounted on the substrate 10 in other manners. When the element includes filters, a plurality of filters may be provided on each of the substrates 20 as in the first and second embodiments, or a plurality of filters may be provided on one substrate 20.

As in the first and second embodiments, the multiplexer includes the transmit filters 60 and 64 (a first filter) and the receive filters 62 and 66 (a second filter). In this case, as in the sample D of the first embodiment and FIG. 13B of the second embodiment, the grounds of the transmit filters 60 and 64 are connected to the ground terminal Gnd1 to which the terminals 18a at respective ends of the side 11b are connected on the lower surface of the substrate 10. The grounds of the receive filters 62 and 66 are connected to the ground terminal Gnd2 to which the terminals 18a at respective ends of the side 11a are connected on the lower surface of the substrate 10. The ground terminals Gnd1 and Gnd2 are electrically separated in the substrate 10. This structure reduces the leakage of signals through the ground terminals Gnd2 and Gnd1. Therefore, the isolation characteristics between the transmit filter (60 and 64) and the receive filter (62 and 66) are improved.

The transmit terminal (Tx, or Tx1 and Tx2) (an input or output terminal) of the transmit filter (60, or 60 and 64) is connected to the terminal 18b located between the terminals 18a at respective ends of the side 11b, and the receive terminal (Rx, or Rx1 and Rx2) (an input or output terminal) of the receive filter (62, or 62 and 66) is connected to the terminal 18b located between the terminals 18a at respective ends of the side 11a. Therefore, the transmit terminal (Tx, or Tx1 and Tx2) is surrounded by the ground terminal Gnd1, and the receive terminal (Rx, or Rx1 and Rx2) is surrounded by the ground terminal Gnd2. Thus, signal leakage between the transmit terminal (Tx, or Tx1 and Tx2) and the receive terminal (Rx, or Rx1 and Rx2) is further reduced.

The terminal 18c located between the terminals 18a at respective ends of the side 11c is configured to be the common terminal Ant. This configuration reduces the signal leakage between the common terminal Ant and the transmit terminal (Tx, or Tx1 and Tx2), and the signal leakage between the common terminal Ant and the receive terminal (Rx, or Rx1 and Rx2).

In the first and second embodiments, a case where the first filter and the second filter are the transmit filter and the receive filter, respectively is described, but when the electronic component is an electronic component in which the isolation between the first filter and the second filter is important, the first filter and the second filter may be both the transmit filters, or may be both the receive filters. It is preferable that the passband of the first filter and the passband of the second filter do not overlap. The quadplexer and the duplexer have been described as an example of the multiplexer, but the multiplexer may be a multiplexer including three filters or a multiplexer including five or more filters.

Although the embodiments of the present invention have been described in detail, the present invention is not limited to such a specific embodiment, and it is to be understood that the various change, substitutions, and alterations could be made hereto without departing from the spirit and scope of the invention.

What is claimed is:

1. An electronic component comprising:
    a first substrate having a substantially quadrangular planar shape and having a first surface and a second surface, the first surface and the second surface being opposite to each other;
    an element disposed on the first surface;
    four first terminals located adjacent to four corners on the second surface, respectively; and
    a second terminal located between the first terminals at respective ends of each of two sides opposite to each other of the second surface, an area of the second terminal being smaller than an area of each of the first terminals at the respective ends of each of the two sides, a width of the second terminal in an extension direction in which each of the two sides extends being equal to or less than a width of each of the first terminals at the respective ends of each of the two sides in the extension direction.

2. The electronic component according to claim 1, wherein in at least one side of the two sides, a first side, which is opposite to the at least one side of the two sides, of the second terminal is arranged closer to a center of the second surface than a first side, which is opposite to the at least one side of the two sides, of the first terminal.

3. The electronic component according to claim 1, wherein the first terminals at respective ends of at least one side of the two sides are interconnected on the second surface.

4. The electronic component according to claim 1, wherein the second terminal is provided in plural between the first terminals at respective ends of at least one side of the two sides.

5. The electronic component according to claim 1, wherein a width of each of the first terminals at respective ends of at least one side of the two sides in an extension direction of each of the two sides is greater than a width of the second terminal in the extension direction.

6. The electronic component according to claim 1, wherein a width of each of the first terminals at respective ends of at least one side of the two sides in a direction perpendicular to the extension direction is greater than a width of the second terminal in the direction perpendicular to the extension direction.

7. The electronic component according to claim 1, further comprising a third terminal located between the first terminals at respective ends of at least one side other than the two sides in an extension direction of the at least one side other than the two sides, an area of the third terminal being less than an area of each of the first terminals at the respective ends of the at least one side other than the two sides, a width of the third terminal in the extension direction of the at least one side other than the two sides being equal to or less than a width of each of the first terminals at the respective ends of the at least one side other than the two sides in the extension direction of the at least one side other than the two sides.

8. The electronic component according to claim 1, wherein the first terminals at respective ends of at least one side other than the two sides extend in an extension direction of the at least one side other than the two sides and are interconnected on the second surface, no other terminals being located between the first terminals at the respective ends of the at least one side other than the two sides.

9. The electronic component according to claim 1, further comprising a second substrate flip-chip mounted on the first substrate, wherein the element is disposed on a first surface, which is located closer to the first substrate, of the second substrate.

10. The electronic component according to claim 1, wherein the first substrate is a low temperature co-fired ceramics (LTCC) substrate.

11. The electronic component according to claim 1, wherein the element includes an acoustic wave element.

12. A multiplexer comprising:
the electronic component according to claim 11.

13. The multiplexer according to claim 12, wherein:
the element includes a first filter and a second filter,
the first terminals at respective ends of one side of the two sides are interconnected on the second surface and are connected to a ground of the first filter, and the first terminal at respective ends of another side of the two sides are interconnected on the second surface and are connected to a ground of the second filter, and
the first terminals at the respective ends of the one side and the first terminals at the respective ends of the another side are electrically separated in the first substrate.

14. The multiplexer according to claim 13, wherein:
an input terminal or an output terminal of the first filter is connected to a second terminal located between the first terminals at the respective ends of the one side, and
an input terminal or an output terminal of the second filter is connected to another second terminal located between the first terminals at the respective ends of the another side.

15. A module comprising:
the multiplexer according to claim 12.

* * * * *